(12) United States Patent
Hoya

(10) Patent No.: US 11,606,090 B2
(45) Date of Patent: Mar. 14, 2023

(54) SEMICONDUCTOR DEVICE

(71) Applicant: FUJI ELECTRIC CO., LTD., Kanagawa (JP)

(72) Inventor: Masashi Hoya, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/486,972

(22) Filed: Sep. 28, 2021

(65) Prior Publication Data

US 2022/0149839 A1 May 12, 2022

(30) Foreign Application Priority Data

Nov. 12, 2020 (JP) .............................. JP2020-188983

(51) Int. Cl.
| | | |
|---|---|---|
| *H03K 17/00* | (2006.01) | |
| *H03K 17/687* | (2006.01) | |
| *H03K 17/56* | (2006.01) | |
| *H02P 27/06* | (2006.01) | |

(52) U.S. Cl.
CPC ......... *H03K 17/6874* (2013.01); *H03K 17/56* (2013.01); *H02P 27/06* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 9,438,148 B2* | 9/2016 | Fuse | .......................... | H02P 6/12 |
| 2001/0028572 A1* | 10/2001 | Takanashi | ............. | H02M 7/538 |
| | | | | 363/58 |
| 2003/0193819 A1 | 10/2003 | Iwagami | | |
| 2010/0201407 A1* | 8/2010 | Falter | ................. | H03K 17/0822 |
| | | | | 327/110 |
| 2011/0285335 A1* | 11/2011 | Tada | ........................ | H02M 1/32 |
| | | | | 318/400.3 |
| 2012/0133420 A1* | 5/2012 | Draxelmayr | ......... | H03K 5/1515 |
| | | | | 327/365 |
| 2013/0151825 A1* | 6/2013 | Huynh | .................... | H02M 1/08 |
| | | | | 713/1 |
| 2016/0013638 A1* | 1/2016 | Glas | .................... | H01L 27/0255 |
| | | | | 361/56 |
| 2017/0264230 A1* | 9/2017 | Yamada | .................. | H02M 1/32 |

(Continued)

FOREIGN PATENT DOCUMENTS

| | | | |
|---|---|---|---|
| DE | 102010064410 A1 * | 8/2011 | |
| JP | 2003309982 A | 10/2003 | |
| JP | 2017163392 A | 9/2017 | |

*Primary Examiner* — Tuan T Lam

(57) ABSTRACT

Provided is a semiconductor device comprising a high-side switching device, a low-side switching device, a high-side driver configured to turn on/off the high-side switching device, a low-side driver configured to turn on/off the low-side switching device, a high-side driving external terminal configured to supply a power supply voltage for driving the high-side driver, and a protection circuit section connected to the high-side driving external terminal. The high-side driver may include a reference potential terminal set to a reference potential of the high-side driver. The protection circuit section may be connected between the high-side driving external terminal and the reference potential terminal.

22 Claims, 17 Drawing Sheets

(56) References Cited

U.S. PATENT DOCUMENTS

| | | | |
|---|---|---|---|
| 2017/0302178 A1* | 10/2017 | Bandyopadhyay | ... H03F 3/2171 |
| 2020/0153338 A1* | 5/2020 | Ribarich | ................. H02M 1/08 |
| 2020/0258880 A1* | 8/2020 | Takahashi | ........... H01L 27/0292 |
| 2021/0098444 A1* | 4/2021 | Boufnichel | ....... H01L 21/76224 |
| 2021/0226444 A1* | 7/2021 | Fang | ................. H03K 17/0822 |

\* cited by examiner

SEMICONDUCTOR DEVICE

The contents of the following Japanese patent applications are incorporated herein by reference:
No. 2020-188983 filed in JP on Nov. 12, 2020.

BACKGROUND

1. Technical Field

The present invention relates to a semiconductor device.

2. Related Art

Conventionally, in the semiconductor device comprising "a half-bridge circuit in which switching devices are connected in series on a high-pressure side and on a low-pressure side," it is known to provide "a noise removing means to remove a noise occurring on the wiring that is to be connected to the low-pressure side terminal of the switching device on the low-pressure side (for example, see Patent Document 1). [Patent Document 1] Japanese Patent Application Publication No. 2003-309982

DESCRIPTION OF EXEMPLARY EMBODIMENTS

Hereinafter, the present invention will be described through embodiments of the invention, but the following embodiments do not limit the claimed invention. In addition, not all combinations of features described in the embodiments necessarily are essential to solving means of the invention.

Figure 1A:
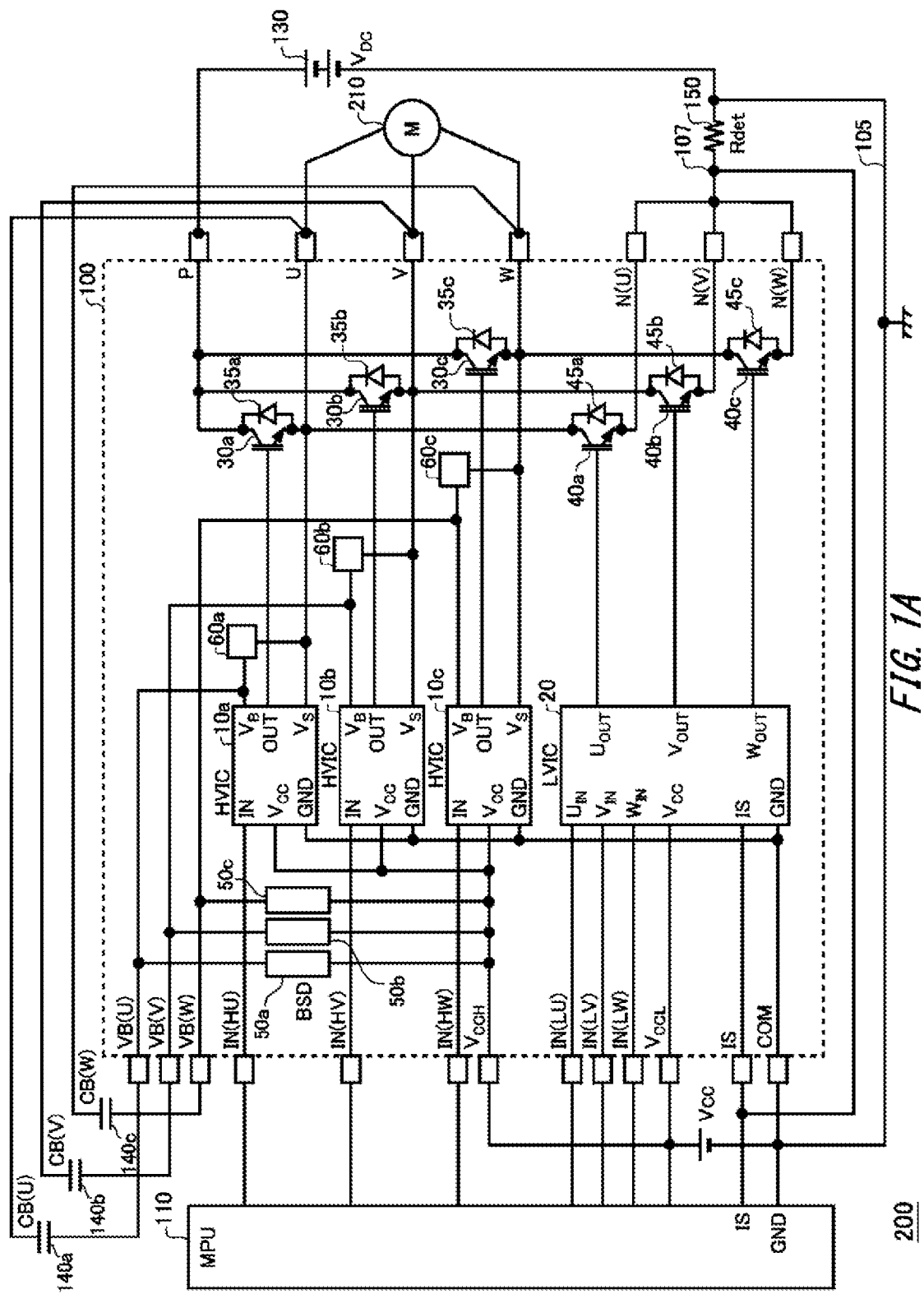
FIG. 1A shows an example of a semiconductor system 200 according to the present embodiment.

FIG. 1A shows an example of a semiconductor system 200 according to the present embodiment. The semiconductor system 200 of the present example is connected to a load 210.

The semiconductor system 200 turns on/off a current which is delivered to the load 210. The semiconductor system 200 may serve as an inverter for driving a motor or a power conversion apparatus such as a DC-DC converter. The semiconductor system 200 of the present example comprises a semiconductor device 100, a control section 110, a power supply 130, capacitors 140, and a current detection resistor 150.

The semiconductor device 100 is used for delivering electrical power to the load 210, which consumes electrical power, and may be an intelligent power module (IPM) comprising a switching device, a driving circuit, a protection circuit and the like. The semiconductor device 100 of the present example comprises high-side drivers 10, a low-side driver 20, high-side switching devices 30, high-side diodes 35, low-side switching devices 40, low-side diodes 45, bootstrap sections 50, and protection circuit sections 60.

The high-side switching devices 30 and the low-side switching devices 40 turn on/off a current to be delivered to the load 210. The high-side switching devices 30 each and the low-side switching devices 40 each may be a switching device of a voltage drive type, for example a IGBT. Alternatively, the switching devices each may be a MOSFET (Metal Oxide Semiconductor Field Effective Transistor), such as a power MOSFET, or one using a wide gap semiconductor, such as SiC, GaN, diamond, gallium nitride based material, gallium oxide based material, AlN, AlGaN, or ZnO.

The high-side switching devices 30 are each provided between a positive terminal P and the output terminal for each phase (U, V, W). The high-side switching devices 30 switch whether to connect the positive terminal P and the load 210 in accordance with a gate voltage which is input to the gate terminal.

The low-side switching devices 40 are each provided between negative terminals (N (U), N (V), N (W)) and the output terminals of each phase (U, V, W), respectively. The low-side switching devices 40 switch whether to connect the negative terminals (N (U), N (V), N (W)) and the load 210 in accordance with a gate voltage which is input to the gate terminal.

The high-side diodes 35 are each a FWD (Free Wheel Diode) for commutating a load current from the load 210. The high-side diodes 35 are each connected in parallel to the high-side switching devices 30. The high-side diodes 35 may each be the one using a wide gap semiconductor, or may be achieved by a parasitic diode in a case where the high-side switching devices 30 are each a MOSFET. Each of the high-side switching devices 30 and each of the high-side diodes 35 constitute an upper arm (that is, a high voltage side arm).

Similarly, the low-side diodes 45 are each connected in parallel to the low-side switching devices 40, and is a FWD for commutating a load current from the load 210. The low-side diodes 45 may each be the one using a wide gap semiconductor, or may be achieved by a parasitic diode in a case where the low-side switching devices 40 are each a MOSFET. Each of the low-side switching devices 40 and each of the low-side diodes 45 constitute a lower arm (that is, a low voltage side arm).

Nodes each of which connects an emitter terminal of the upper arm and a collector terminal of the lower arm are each connected to the output terminal of each phase, U to W. The collector terminals of the upper arm are each connected to the positive terminal P of each phase. The collector terminals of the upper arm of the present example are connected to a common positive terminal P. The emitter terminals of the lower arm are each connected to the negative terminal of each phase (N (U), N (V), N (W)). The upper arm and the lower arm of each phase constitute a half-bridge circuit.

The negative terminals (N (U), N (V), and N (W)) are connected to a terminal 107 which is a common negative terminal where the negative terminals are interconnected outside the semiconductor device 100. Between the positive terminal P and the terminal 107, a power supply 130 which is a DC power supply for output is connected.

The high-side drivers 10 are each an HVIC (High-Voltage IC) which turns on/off the high-side switching devices 30 by driving the high-side switching devices 30, which are on the upper arm side. The high-side drivers 10 each supply the gate terminal of the high-side switching devices 30 with the gate voltage corresponding to gate control input signals (HU, HV, HW) which are from the control section 110 so as to control the on/off state of the high-side switching devices 30. The semiconductor device 100 of the present example comprises three high-side drivers: a high-side driver 10a to a high-side driver 10c, each of which corresponds to each phase.

The high-side drivers 10 are each connected to the gate terminal and emitter terminal of the corresponding one of the high-side switching devices 30. The gate terminal of each of the high-side switching devices 30 is connected to the gate output terminals OUT of the corresponding one of the high-side drivers 10. The emitter terminal of each of the high-side switching devices 30 is connected to the reference potential terminal Vs of the corresponding one of the high-side drivers 10. The high-side drivers 10 each control the collector-emitter conduction and interruption of the corresponding one of the high-side switching devices 30 by controlling the terminal voltage between the gate output terminal OUT and the reference potential terminal Vs.

Thereby, the high-side driver 10a to high-side driver 10c turns on/off the high-side switching device 30a to high-side switching device 30c of the U-phase, V-phase, and W-phase, respectively. The high-side drivers 10 are each connected to the emitter terminal of one of the high-side switching devices 30 and each have a reference potential terminal Vs which is set to be the reference potential of the respective high-side drivers 10. The reference potential of the respective high-side driver 10 is the potential on the emitter side of the corresponding one of the high-side switching devices 30.

Note that the high-side driver 10a to the high-side driver 10c each have a different reference potential of operation, and thus each of these drivers serves as an independent driver IC for each phase. Therefore, the high-side driver 10a to the high-side driver 10c may be integrated into one IC if independent reference potentials for each phase are provided in the interior of the IC.

The low-side driver 20 is a LVIC (Low-Voltage IC) which turns on/off the low-side switching devices 40 by driving the low-side switching devices 40, which are on the lower arm side. The low-side driver 20 supplies the gate terminal of each of the low-side switching devices 40 with the gate voltage corresponding to gate control input signals (LU, LV, LW) which are from the control section 110 so as to control the on/off state of the low-side switching devices 40.

The low-side driver 20 of the present example is connected to three low-side switching devices: the low-side switching device 40a to the low-side switching device 40c. The low-side driver 20 has three gate output terminals ($U_{OUT}$, $V_{OUT}$, and $W_{OUT}$) and is connected to each of the gate terminals of three low-side switching devices: the low-side switching device 40a to the low-side switching device 40c.

Also, the low-side driver 20 is connected to an overcurrent detect external terminal IS, and receives a sense voltage having been detected at the current detection resistor 150. In a case where the sense voltage is higher than a threshold, the low-side driver 20 detects overcurrent flowing through a plurality of the side switching devices: the low-side switching device 40a to the low-side switching device 40c. In response to the detection of the overcurrent, the low-side driver 20 may perform protection operations, for example turning off the plurality of the low-side switching devices: the low-side switching device 40a to the low-side switching device 40c.

The low-side driver 20 has a power supply voltage input terminal $V_{CC}$, which is connected to a low side control power supply terminal $V_{CCL}$, and a ground terminal GND, which is connected to a common external ground terminal COM, and operates using the voltage between the power supply voltage input terminal $V_{CC}$ and the ground terminal GND for its power supply voltage. The emitter terminals of the low-side switching devices 40 are connected to the common external ground terminal COM via the current detection resistor 150. In other words, the low-side drivers 20 each operate using the potential of the emitter side of the low-side switching device 40a to the low-side switching device 40c as its reference potential. The low-side driver 20 controls the on/off state of the low-side switching devices 40 by controlling the terminal voltages between each of the gate output terminals ($U_{OUT}$, $V_{OUT}$, $W_{OUT}$) and the ground terminal GND.

The control section 110 is a micro controller which controls the driving of the semiconductor device 100. In order to rotate a motor, which is the load 210, at a predetermined rotation speed, the control section 110 generates gate control input signals (HU, HV, HW, LU, LV, and LW) and supplies those signals to the high-side driver 10a to high-side driver 10c and the low-side driver 20 via the external terminals IN. In an example, the control section 110 controls each gate control input signal by means of a PWM (pulse-width modulation) control.

The load 210 is connected to the semiconductor device 100. Although the load 210 of the present example is a three-phase motor, which has three phases: the U-phase, V-phase and W-phase, it can be a two-phase (that is, single-phase) motor. The semiconductor device 100 may include a number half-bridge circuits corresponding to the number of phases of the motor.

The bootstrap sections 50 are used for charging the capacitors 140 by the power supply voltage from a high-side control power supply terminal $V_{CCH}$. The bootstrap sections 50 are each arranged between the high-side control power supply terminal $V_{CCH}$ and each of high-side driving external terminals VB. Also, the bootstrap sections 50 are connected between the high-side driving external terminals VB and the power supply voltage input terminals $V_{CC}$. The detail of the bootstrap sections 50 will be described later.

The protection circuit sections 60 each serves as a power supply protection circuit on the high side for absorbing a surge which has occurred. The protection circuit sections 60 are electrically connected to the high-side driving external terminals VB which supply a power supply voltage for driving the high-side drivers 10. The protection circuit sections 60 of the present example are provided between the high-side driving external terminals VB and the reference potential terminals Vs. Also, the protection circuit sections 60 are connected between the high-side power supply terminals Vs and the emitter terminals of the high-side switching devices 30. The high-side power supply terminals Vs are connected to the high-side driving external terminals VB. The protection circuit sections 60 may be provided for each phase of the U, V, W phases. The detail of the protection circuit sections 60 will be described later.

The capacitors 140 are charged via the bootstrap sections 50 to operate the high-side drivers 10. The capacitors 140 each serves as a bootstrap capacitor for boosting the power supply of the high-side drivers 10. The capacitors 140 supply each of the high-side drivers 10 of each phase with the power supply voltage via the high-side driving external terminals VB.

The capacitor 140a is connected between the high-side driving external terminal VB (U) and the output terminal U and charged by the bootstrap section 50a. The capacitor 140b is connected between the high-side driving external terminal VB (V) and the output terminal V, and charged by the bootstrap section 50b. The capacitor 140c is connected between the high-side driving external terminal VB (W) and the output terminal W and charged by the bootstrap section 50c. Then, the capacitor 140a to the capacitor 140c supply a power supply voltage to the high-side driver 10a to high-side driver 10c, respectively.

The current detection resistor 150 is connected between the terminal 107 and a reference potential 105. In this variation, the current detection resistor 150 is connected outside the semiconductor device 100 so that the current detection resistor 150 can be changed depending on the circuit connected outside the semiconductor device 100. Alternatively, the current detection resistor 150 may be incorporated in the semiconductor device 100.

Note that in the present example, because the high-side switching devices 30 are driven on at a different timing for each phase, there is no moment when more than two of the plurality low-side switching devices 40 simultaneously are in an on state. Thus, the low-side driver 20 can detect the overcurrent of the low-side switching devices 40 of three phases by using one current detection resistor 150.

Herein, the low-side driver 20 has a function of protecting modules when the overcurrent occurs by detecting the current flowing through the half-bridge circuit of each phase by means of the current detection resistor 150. The current level signal having been detected at the current detection resistor 150 is transmitted to the low-side driver 20 via the overcurrent detect external terminal IS. The low-side driver 20 performs an overcurrent determination and, when overcurrent occurs, protects the lower arm by interrupting the low-side switching devices 40.

On the other hand, when the current level signal having been detected by the current detection resistor 150 is transmitted to the control section 110, if overcurrent occurs, based on the overcurrent determination of the control section 110, the high-side drivers 10 protect the upper arm by interrupting the high-side switching devices 30.

The control section 110 is a micro controller and performs the overcurrent determination by a program handling Due to the program handling, the overcurrent protection on the upper arm side often takes a longer delay time from the overcurrent occurrence to the turn-off action of the high-side switching devices 30 than the overcurrent protection on the lower arm side. The semiconductor device 100 of the present example has protection circuit sections 60 and can thus protect the high-side drivers 10 even if a surge voltage occurs due to the late interruption of the high-side switching devices 30.

Figure 1B:
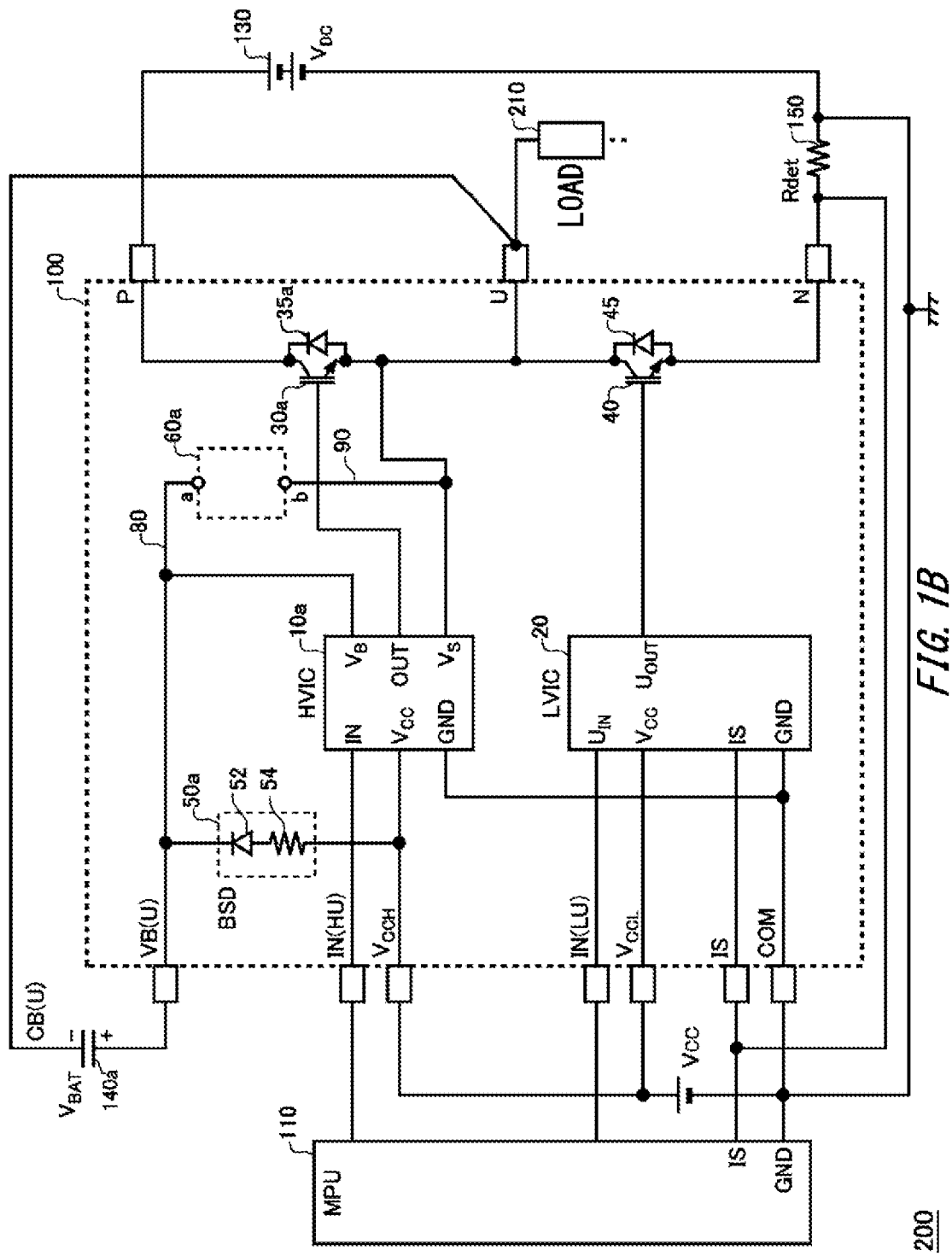
FIG. 1B shows an example of the more specific configuration of the semiconductor system 200.

FIG. 1B shows an example of the more specific configuration of the semiconductor system 200. In the present example, for the sake of a concise description, only the half-bridge circuit of one phase (the U-phase in the present example) among three phases is depicted.

The bootstrap section 50 includes a diode 52 and a resistor 54. The diode 52 and the resistor 54 are connected in series between the high-side driving external terminal VB and the high-side control power supply terminal $V_{CCH}$. The diode 52 serves as a bootstrap diode (BSD) for charging the capacitor 140. The cathode terminal of the diode 52 is connected to the high-side driving external terminal VB. The anode terminal of the diode 52 is connected to the power supply voltage input terminal $V_{CC}$ of the high-side driver 10 via the resistor 54. The configuration of the bootstrap section 50 is not limited thereto. Although in the present example, the bootstrap section 50a of the U-phase is used for explanation, the same holds true for the bootstrap sections 50 of other phases.

The protection circuit section 60 has a terminal a and a terminal b. The specific circuit of the protection circuit section 60 will be described later. The terminal a is connected to a node extension unit 80 of high-side power supply potential. The terminal b is connected to a node extension unit 90 of the reference potential of each phase.

The node extension unit 80 is set to the high-side power supply potential. One end of the node extension unit 80 is connected to the terminal a. The other end of the node extension unit 80 is connected to the high-side driving external terminal VB and the high-side power supply terminal Vs.

The node extension unit 90 is set to the reference potential of each phase. For example, the reference potential on the high side of the U-phase is potential of the emitter terminal of the high-side switching device 30a. One end of the node extension unit 90 is connected to the terminal b. The other end of the node extension unit 90 is connected to the reference potential terminal Vs and the emitter terminal of the high-side switching device 30a.

Figure 2:
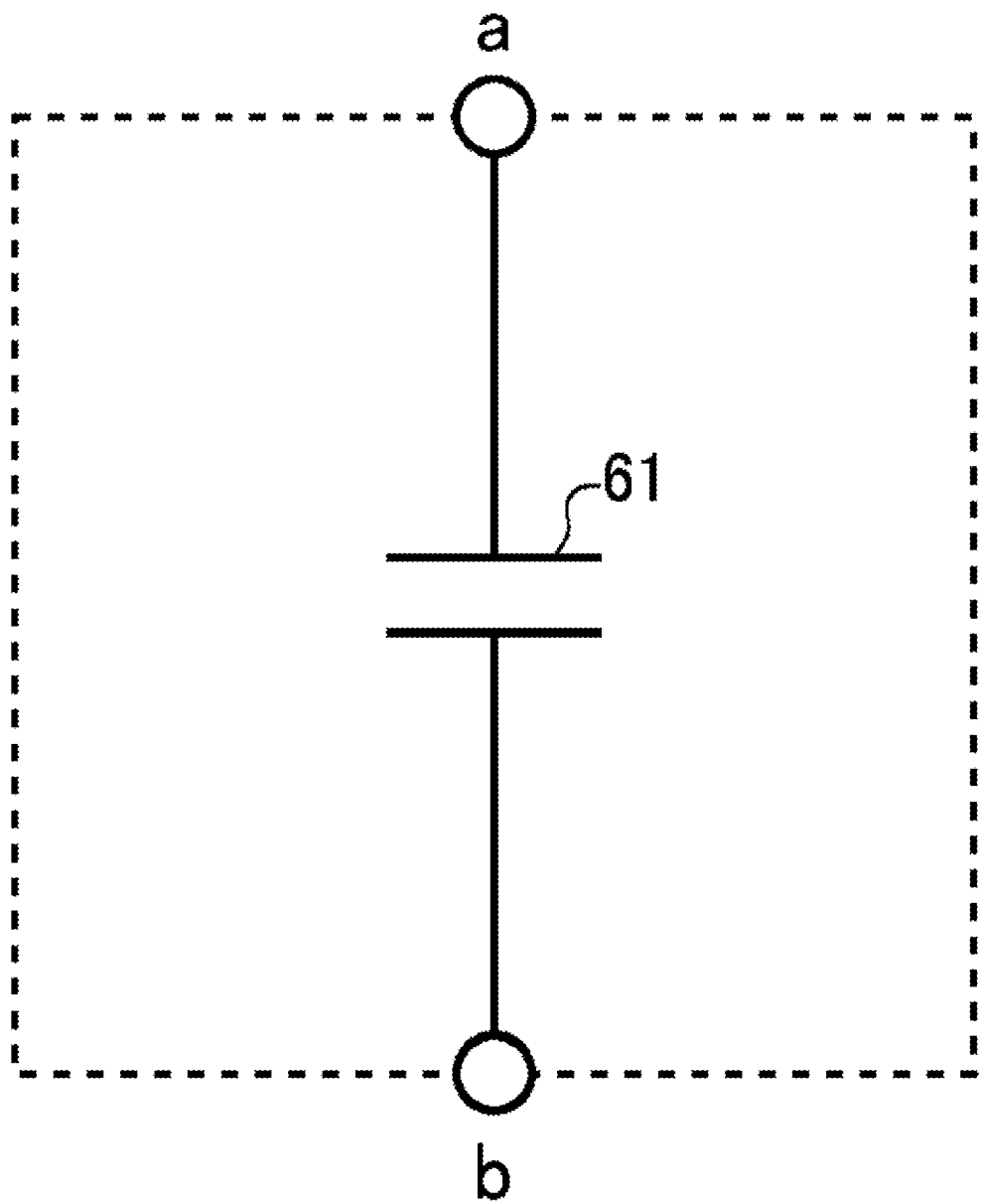
FIG. 2 shows an example of the configuration of the protection circuit section 60.

FIG. 2 shows an example of the configuration of the protection circuit section 60. The protection circuit section 60 of the present example includes a capacitor 61. One end of the capacitor 61 is connected to the terminal a, and the other end is connected to the terminal b. The protection circuit section 60 may be a chip part having a capacitor of a ceramic body or the like and, as described below, may be implemented as a horizontal type semiconductor element or a vertical type semiconductor element. In an example, if the protection circuit section 60 is implemented as a horizontal type semiconductor element, the terminal a and the terminal b are formed on the same plane. If the protection circuit section 60 is implemented as a vertical type semiconductor element, the terminal a and the terminal b are each formed on an opposing plane.

Figure 3A:
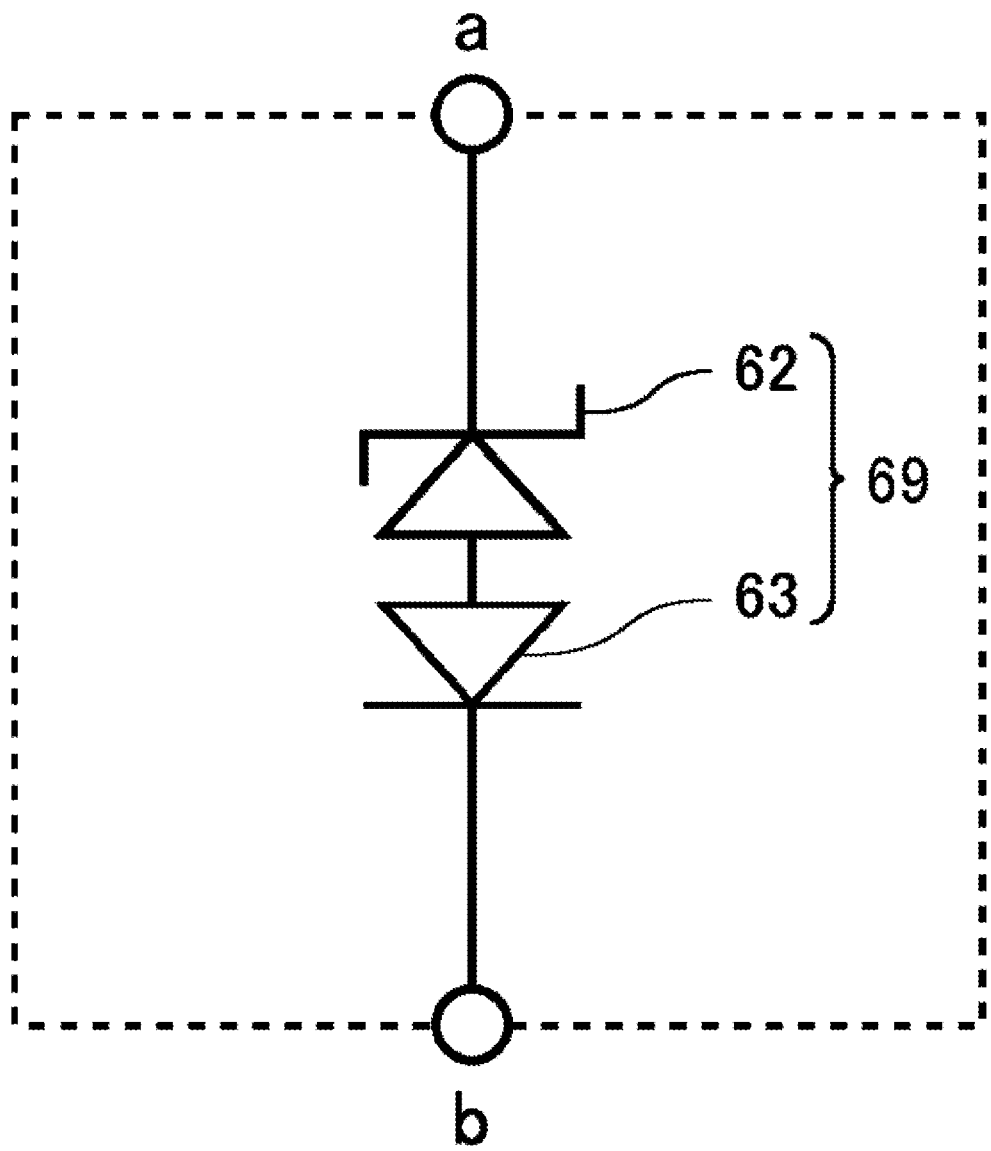
FIG. 3A shows an example of the configuration of the protection circuit section 60.

FIG. 3A shows an example of the configuration of the protection circuit section 60. The protection circuit section 60 of the present example includes a reverse blocking Zener diode 69.

The reverse blocking Zener diode 69 has a Zener diode 62 and a diode 63 connected in series. The cathode terminal of the Zener diode 62 is connected to the terminal a, and the anode terminal of the Zener diode 62 is connected to the anode terminal of the diode 63. The cathode terminal of the diode 63 is connected to the terminal b. Thus, in the reverse blocking Zener diode 69, the cathode terminal of the Zener diode 62 is provided on the terminal a side, and the anode terminal of the Zener diode 62 is provided on the terminal b side.

A breakdown voltage of the Zener diode 62 is selected such that the breakdown voltage is larger than the power supply voltage between the high-side control power supply terminal $V_{CCH}$ and the ground terminal GND, smaller than the withstand voltage of the high-side driver 10. Also, the withstand voltage of the diode 63 is made no less than the power supply voltage between the high-side control power supply terminal $V_{CCH}$ and the ground terminal GND.

Figure 3B:
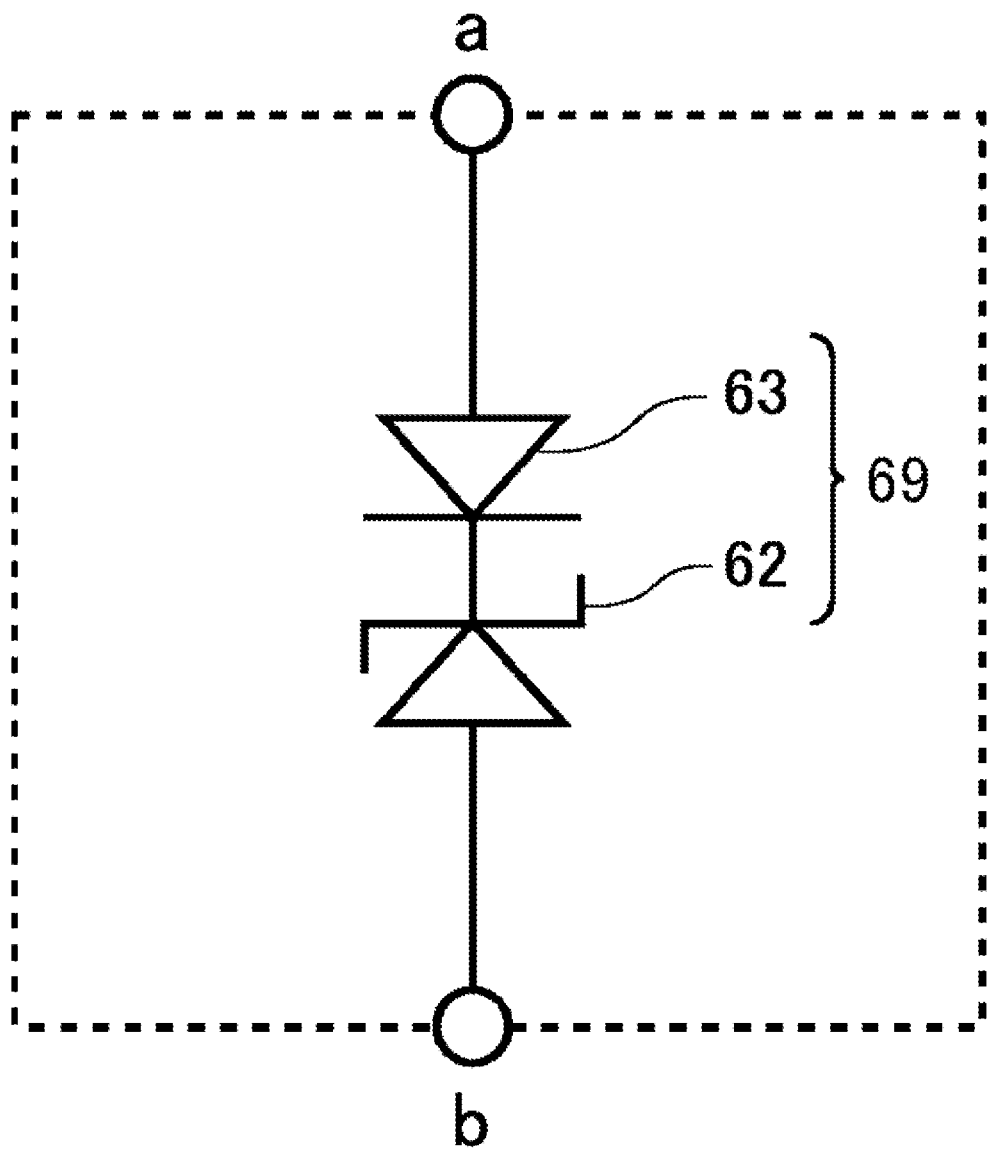
FIG. 3B shows an example of the configuration of the protection circuit section 60.

FIG. 3B shows an example of the configuration of the protection circuit section 60. Although the protection circuit section 60 of the present example includes a Zener diode 62 and a diode 63 connected in series, which are a reverse blocking Zener diode 69, the connection orientation and order is different from that of the protection circuit section 60 of FIG. 3A. The anode terminal of the diode 63 is connected to the terminal a. The cathode terminals of the Zener diode 62 and diode 63 are connected to each other. The anode terminal of the Zener diode 62 is connected to the terminal b. In sum, as with the case of FIG. 3A, in the reverse blocking Zener diode 69, the cathode terminal of the Zener diode 62 is provided on the terminal a side, and the anode terminal of the Zener diode 62 is provided on the terminal b side.

Figure 3C:
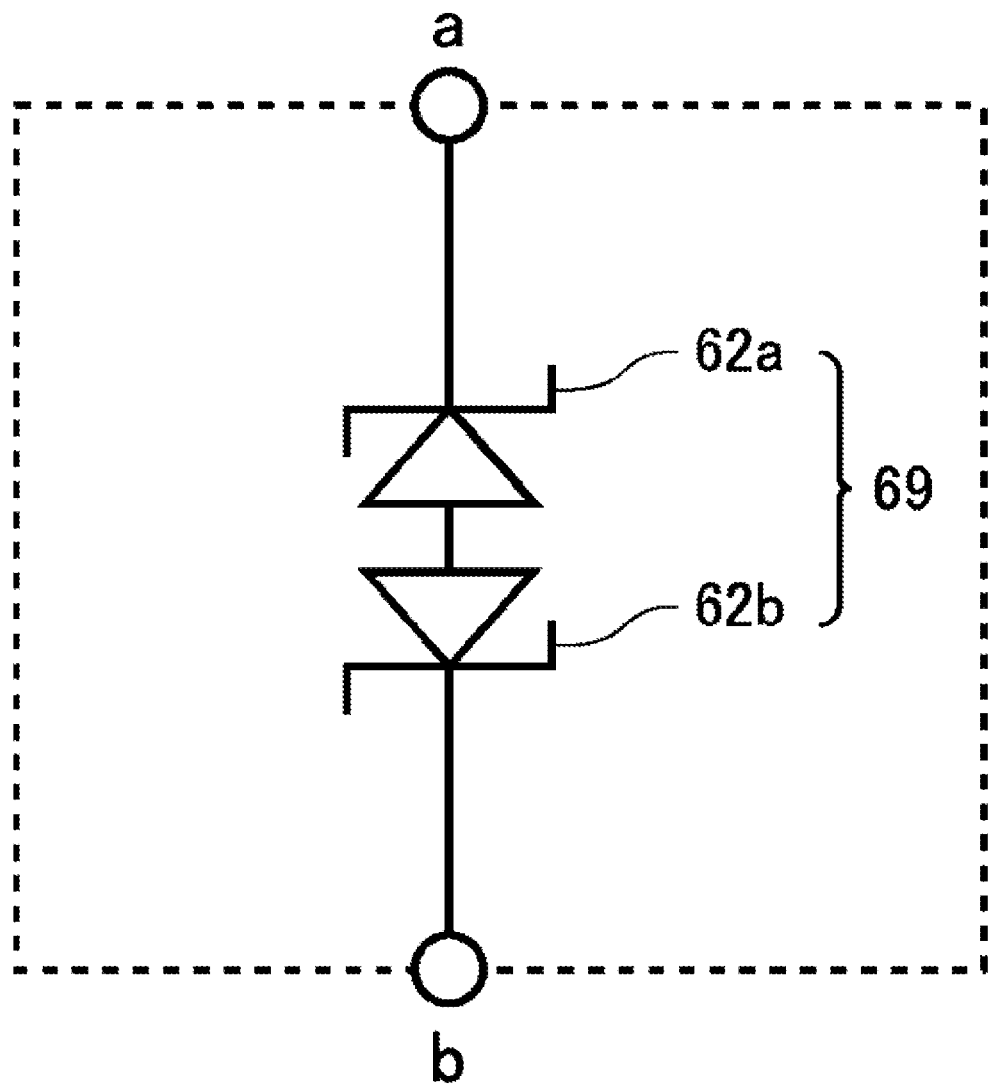
FIG. 3C shows an example of the configuration of the protection circuit section 60.

FIG. 3C shows an example of the configuration of the protection circuit section 60. The protection circuit section 60 of the present example includes a Zener diode 62a and a Zener diode 62b connected in series. The protection circuit section 60 may include more than three Zener diodes 62. The cathode terminal of the Zener diode 62a is connected to the terminal a. The anode terminals of the Zener diode 62a and Zener diode 62b are connected to each other. The cathode terminal of the Zener diode 62b is connected to the terminal b.

Figure 3D:
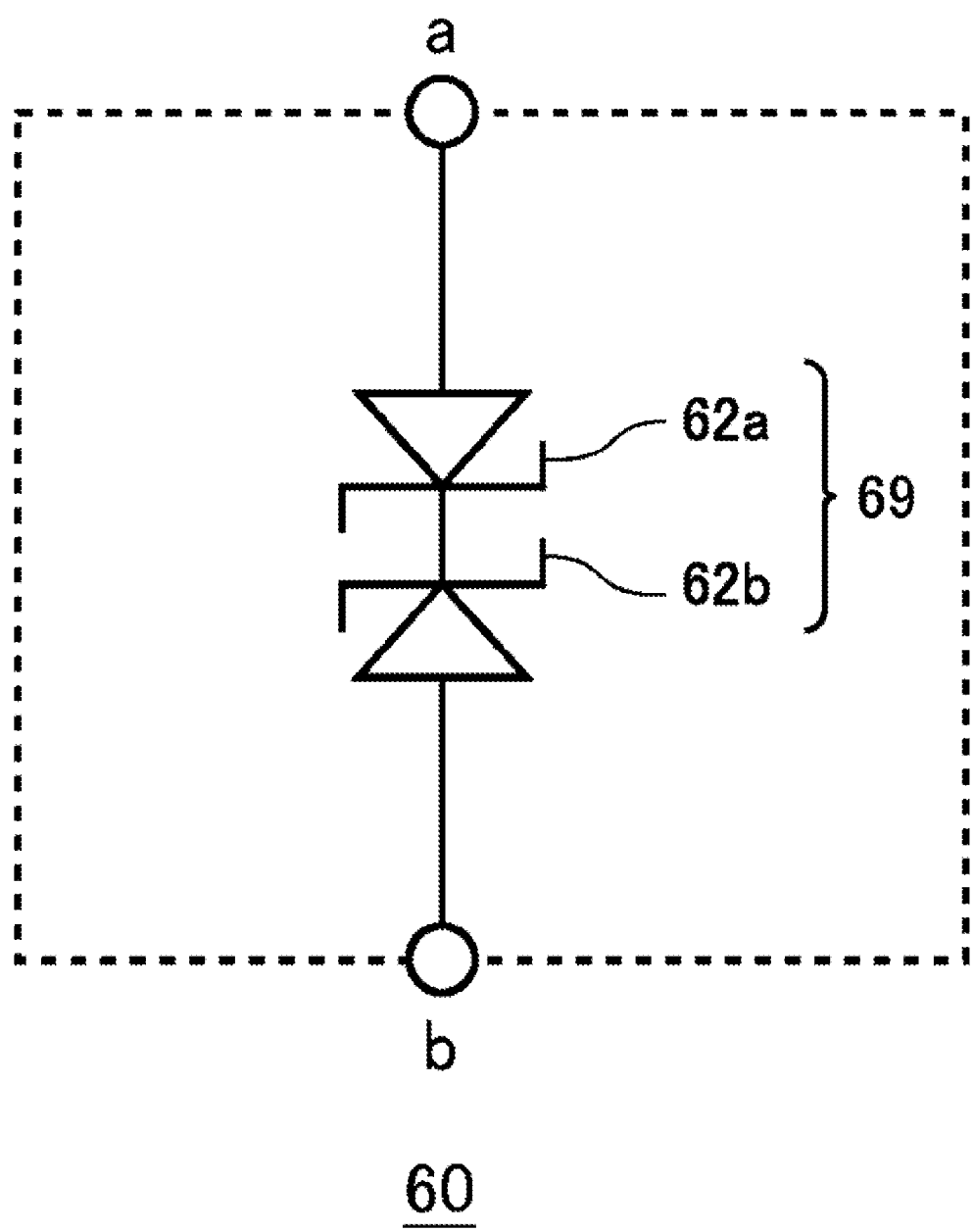
FIG. 3D shows an example of the configuration of the protection circuit section 60.

FIG. 3D shows an example of the configuration of the protection circuit section 60. Although the protection circuit section 60 of the present example includes a Zener diode 62a and a Zener diode 62b connected in series, the connection orientation and order is different from that of the protection circuit section 60 of FIG. 3C. The anode terminal of the Zener diode 62a is connected to the terminal a. The cathode terminals of the Zener diode 62a and Zener diode 62b are connected to each other. The anode terminal of the Zener diode 62b is connected to the terminal b.

Figure 4A:
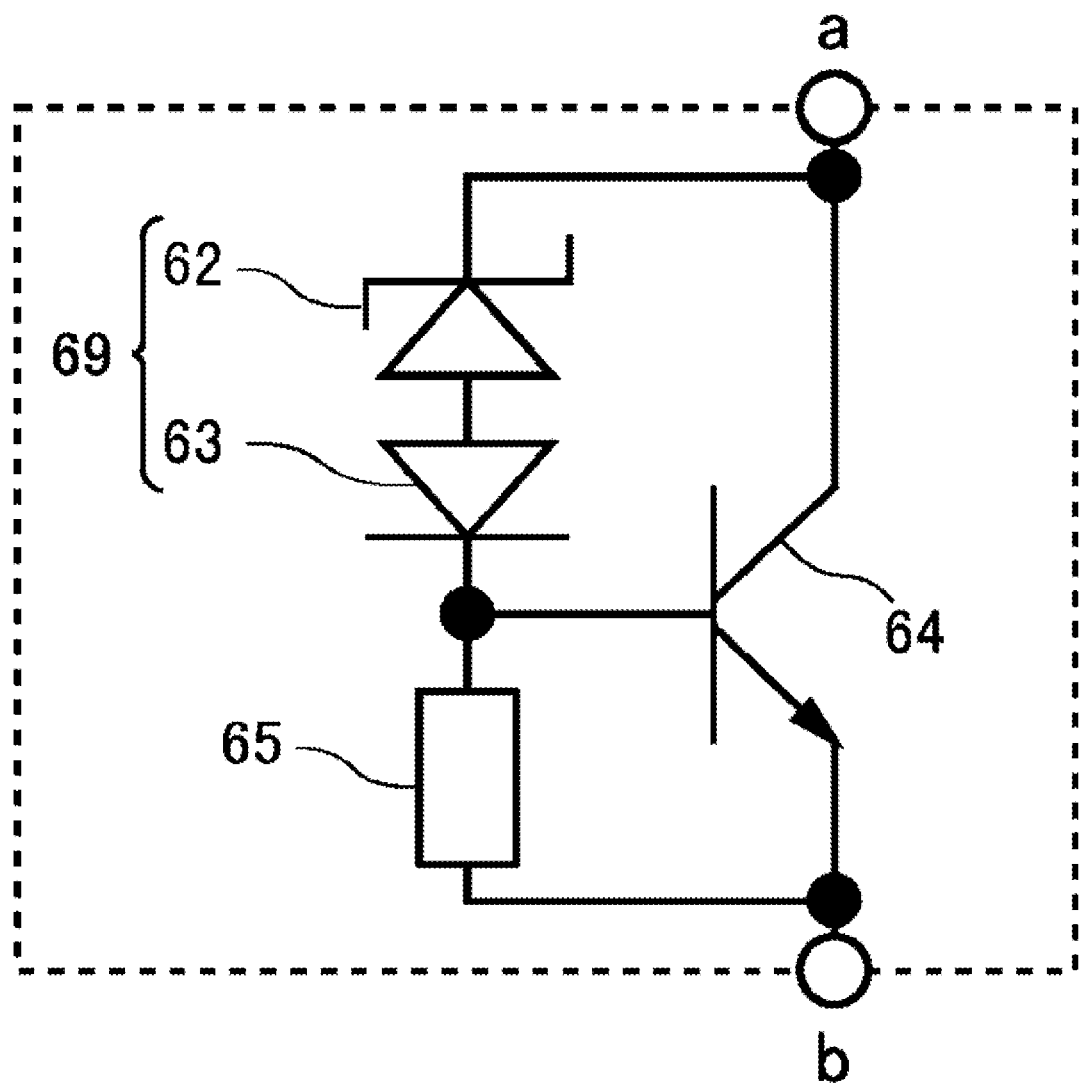
FIG. 4A shows an example of the configuration of the protection circuit section 60 being a dynamic clamp circuit.

FIG. 4A shows an example of the configuration of the protection circuit section 60 being a dynamic clamp circuit. The protection circuit section 60 of the present example includes a Zener diode 62, a diode 63, an npn transistor 64, and a resistor 65. The Zener diode 62 and the diode 63 constitute a reverse blocking Zener diode 69. The resistor 65 may be a base ground resistor. In an example, the protection circuit section 60 is implemented as a vertical type semiconductor element, but it is not limited thereto.

The resistance value of the resistor 65 is set larger than or equal to a resistance value which can restrict the breakdown current of the reverse blocking Zener diode 69 lower than a rated current. The resistance value of the resistor 65 is selected such that, in a state where the control power supply voltage VCC is applied, an npn transistor 64 is not turned on due to a leak current between the collector and base of the npn transistor 64.

The reverse blocking Zener diode 69 is connected between the collector terminal and base terminal of the npn transistor 64. The collector terminal of the npn transistor 64 is connected to the terminal a, and the emitter terminal is connected to the terminal b. The resistor 65 is connected between the base terminal and emitter terminal of the npn transistor 64. The node which is connected to the resistor 65 and the emitter terminal of the npn transistor 64 is connected to the terminal b.

Figure 4B:
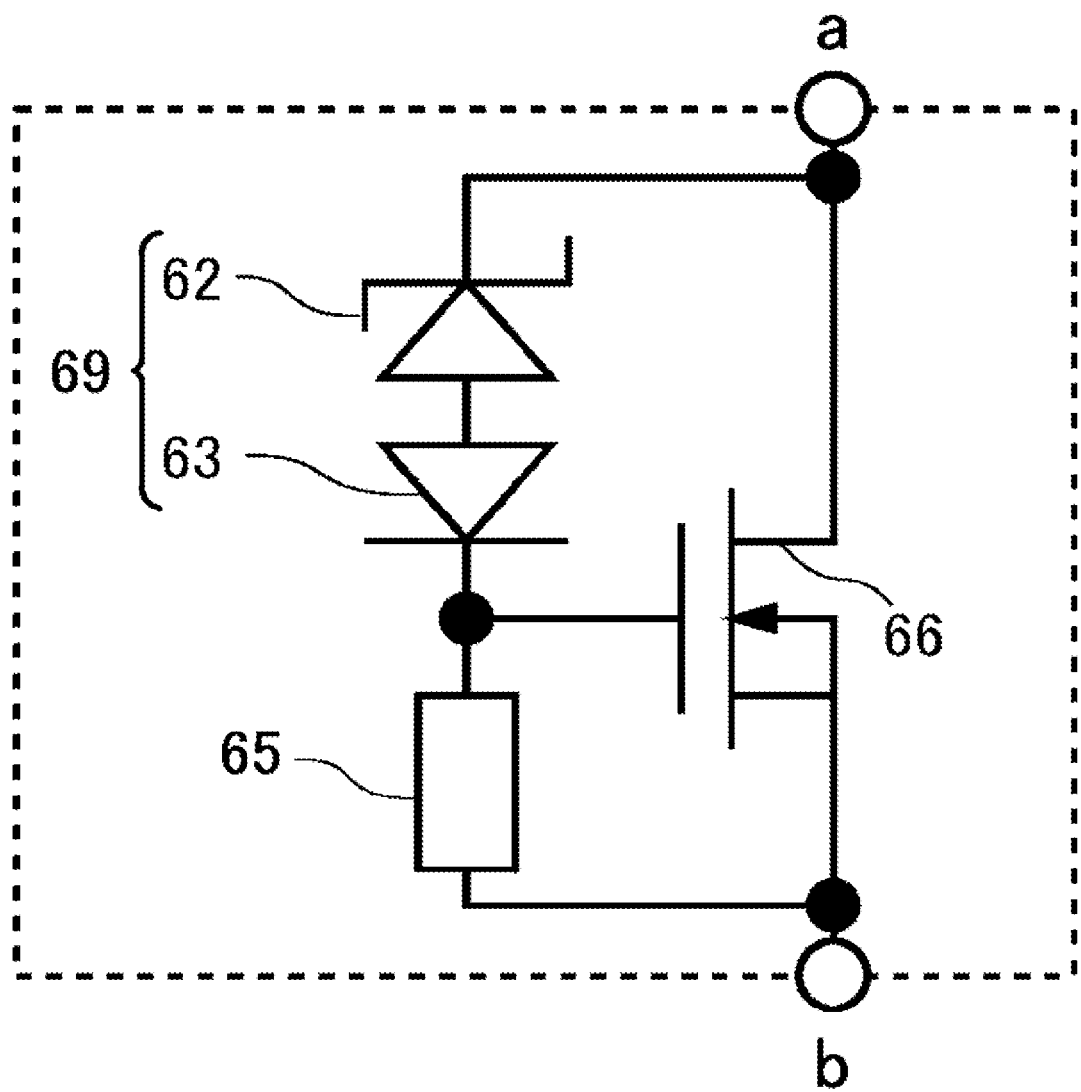
FIG. 4B shows an example of the configuration of the protection circuit section 60 being a dynamic clamp circuit.

FIG. 4B shows an example of the configuration of the protection circuit section 60 being a dynamic clamp circuit. The protection circuit section 60 of the present example is different from the protection circuit section 60 of FIG. 4A in that an n-channel MOSFET 66 is included instead of the npn transistor 64.

One end of a reverse blocking Zener diode 69 is connected to the terminal a, and the other end is connected to the gate terminal of the n-channel MOSFET 66. The drain terminal of the n-channel MOSFET 66 is connected to the terminal a, and the source terminal is connected to the terminal b. A resistor 65 is connected between the gate terminal and source terminal of the n-channel MOSFET 66. Consequently, the resistor 65 may be a gate-to-ground resistor. The node connected to the resistor 65 and the source terminal of the n-channel MOSFET 66 is connected to the terminal b. The protection circuit section 60 of the present example serves as a dynamic clamp circuit and thus can prevent the malfunction and destruction of the high-side driver 10 in a situation where surge voltages are superimposed and exceed a rated voltage of the high-side driver 10.

The protection circuit section 60 being a dynamic clamp circuit can fix (that is, clamp) the voltage between the terminal a and the terminal b by appropriately setting the magnitude of the reverse blocking Zener diode 69 and resistor 65 in a case where the npn transistor 64 or the n-channel MOSFET 66 is turned on. Also, by turning on the npn transistor 64 or the n-channel MOSFET 66 so that surge current flows, an appropriate voltage can be clamped even if a surge with higher energy is applied.

Figure 5A:
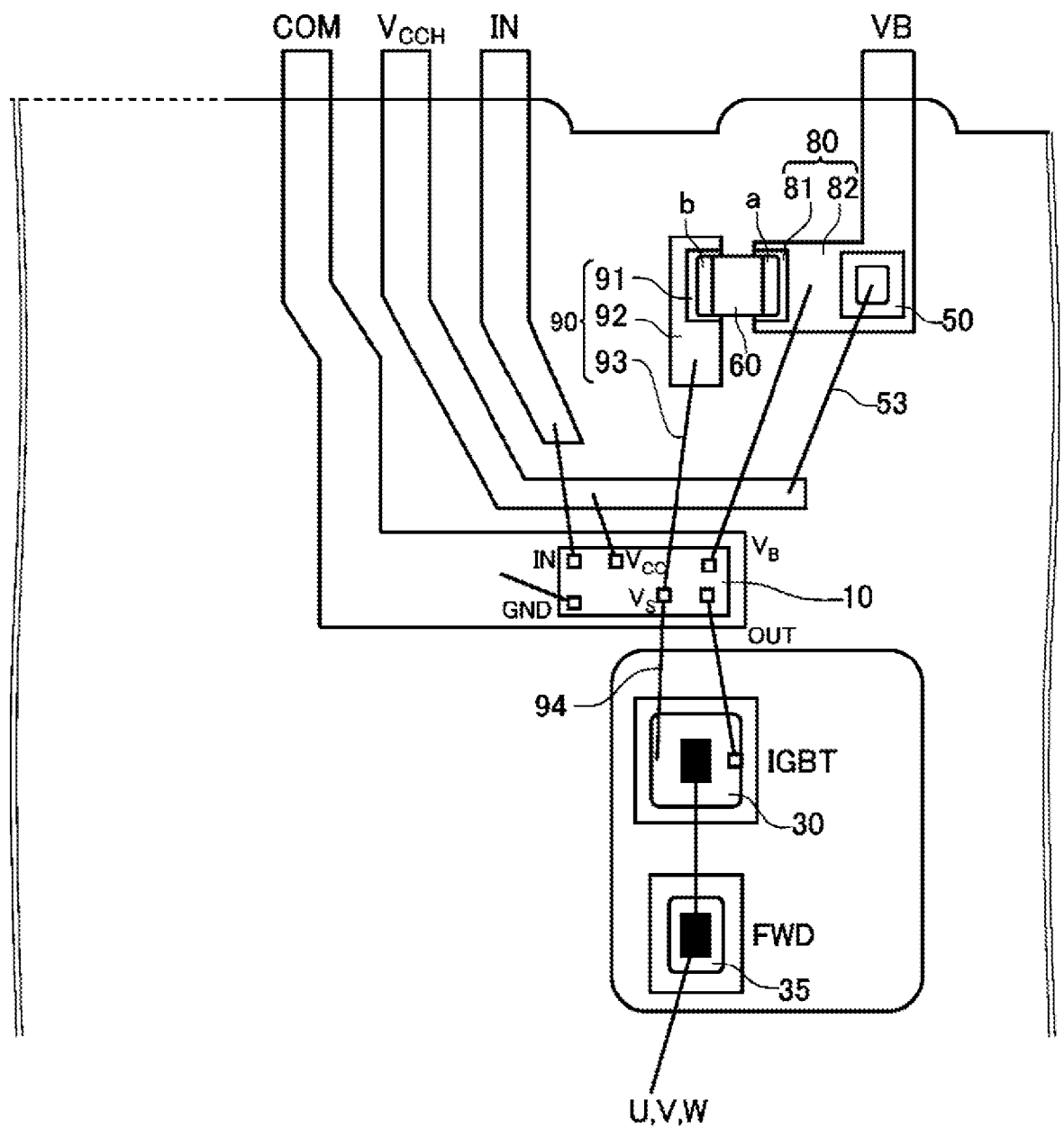
FIG. 5A shows an example of the configuration of the horizontal type protection circuit section 60.

FIG. 5A shows an example of the configuration of the horizontal type protection circuit section 60. The protection circuit section 60 of the present example has a laminated ceramic capacitor being surface mounted.

The protection circuit section 60 has a horizontal type semiconductor element structure. A terminal a is connected to a node extension unit 80, and a terminal b is connected to a node extension unit 90. The terminal a and the terminal b each have an electrode structure which can be bonded by solder or conductive bonding material. The protection circuit section 60 is mounted in a bridging state between the node extension unit 80 and the node extension unit 90.

The node extension unit 80 has a connecting part 81 and an inner lead 82. The connecting part 81 is provided facing the terminal a and is a flat part for connecting the terminal a and an inner lead 82. The inner lead 82 is connected to a high-side driving external terminal VB. On the inner lead 82 of the present example, a bootstrap section 50 is arranged. The bootstrap section 50 is implemented as a vertical type semiconductor element and is connected to a high-side control power supply terminal $V_{CCH}$ by a bonding wire 53.

The node extension unit 90 has a connecting part 91, an inner lead 92, and a bonding wire 93. The connecting part 91 is provided facing the terminal b and is a flat part for connecting the terminal b and the inner lead 92. The connecting part 91 may be provided on the same plane with the connecting part 81. The inner lead 92 is electrically connected to the connecting part 91 and extends in a predetermined direction from the protection circuit section 60. The bonding wire 93 connects the inner lead 92 and a reference potential terminal Vs. Note that the node extension unit 90 is insulated from external terminals such as a high-side driving external terminal VB, an external terminal IN, a high-side control power supply terminal $V_{CCH}$, and a common external ground terminal COM.

A bonding wire 94 electrically connects the reference potential terminal Vs of a high-side driver 10 and the emitter electrode of a high-side switching device 30. The bonding wire 94 of the present example is shorter than the bonding wire 93. In other words, the high-side switching device 30 is arranged closer to the high-side driver 10 than the inner lead 92.

Note that, when the protection circuit section 60 is implemented by a horizontal type semiconductor element, any protection circuit section 60 of FIG. 2 to FIG. 4B may be used. Also, the implementation method of the present example may be applied to each phase of the upper arm in the same way.

Figure 5B:
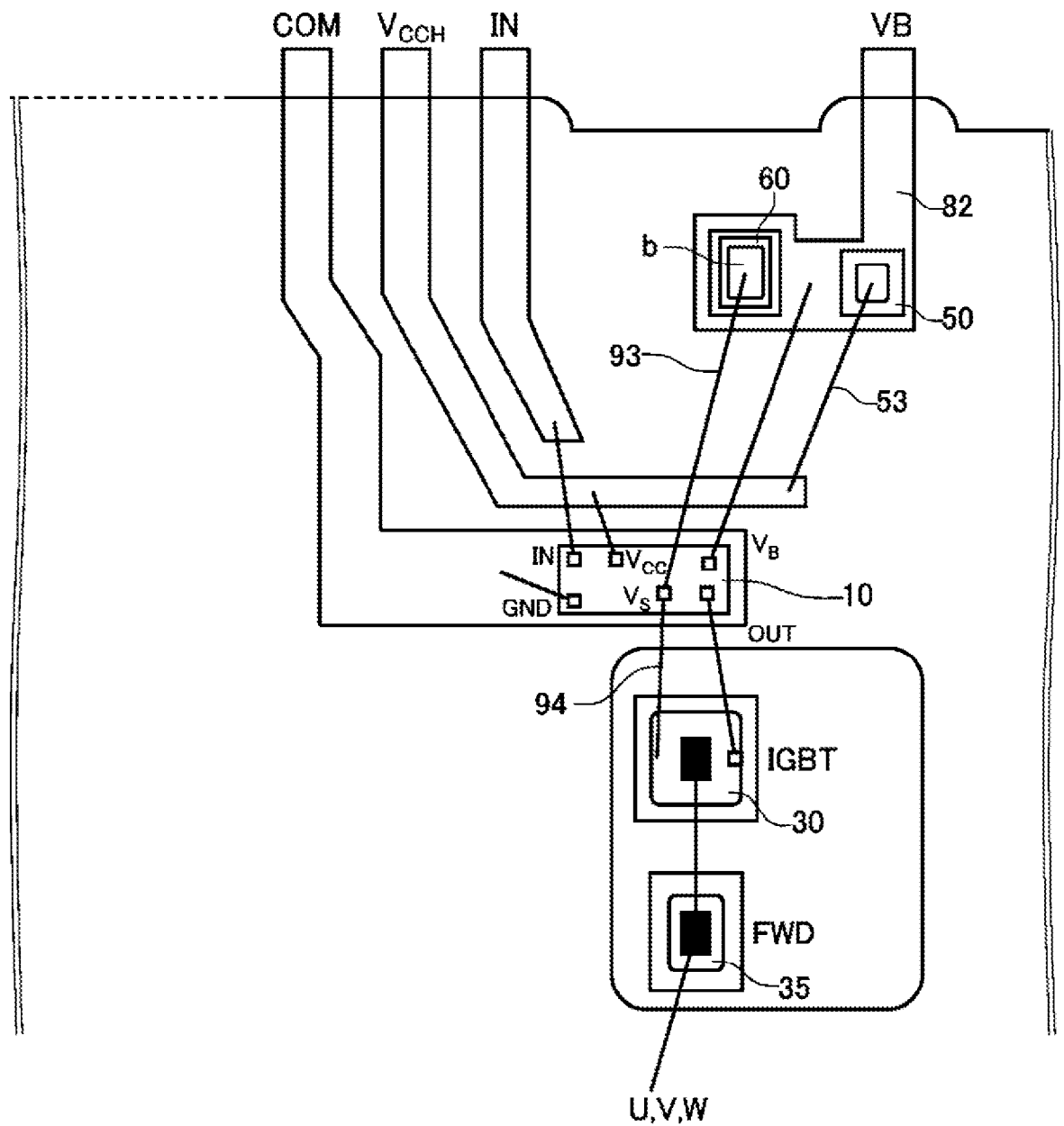
FIG. 5B shows an example of the configuration of the protection circuit section 60 in a vertical arrangement.

FIG. 5B shows an example of the configuration of the protection circuit section 60 in a vertical arrangement. The protection circuit section 60 of the present example has a vertical type semiconductor element structure. In the present example, only points different from the case of FIG. 5A are particularly described.

A terminal a is provided below the semiconductor element of the protection circuit section 60 and is connected to an inner lead 82. A terminal b is provided above the semiconductor element of the protection circuit section 60 and is connected to the bonding wire 93. When the protection circuit section 60 is implemented by a vertical type semiconductor element, any protection circuit section 60 of FIG. 2 to FIG. 4B can be used.

Figure 6A:
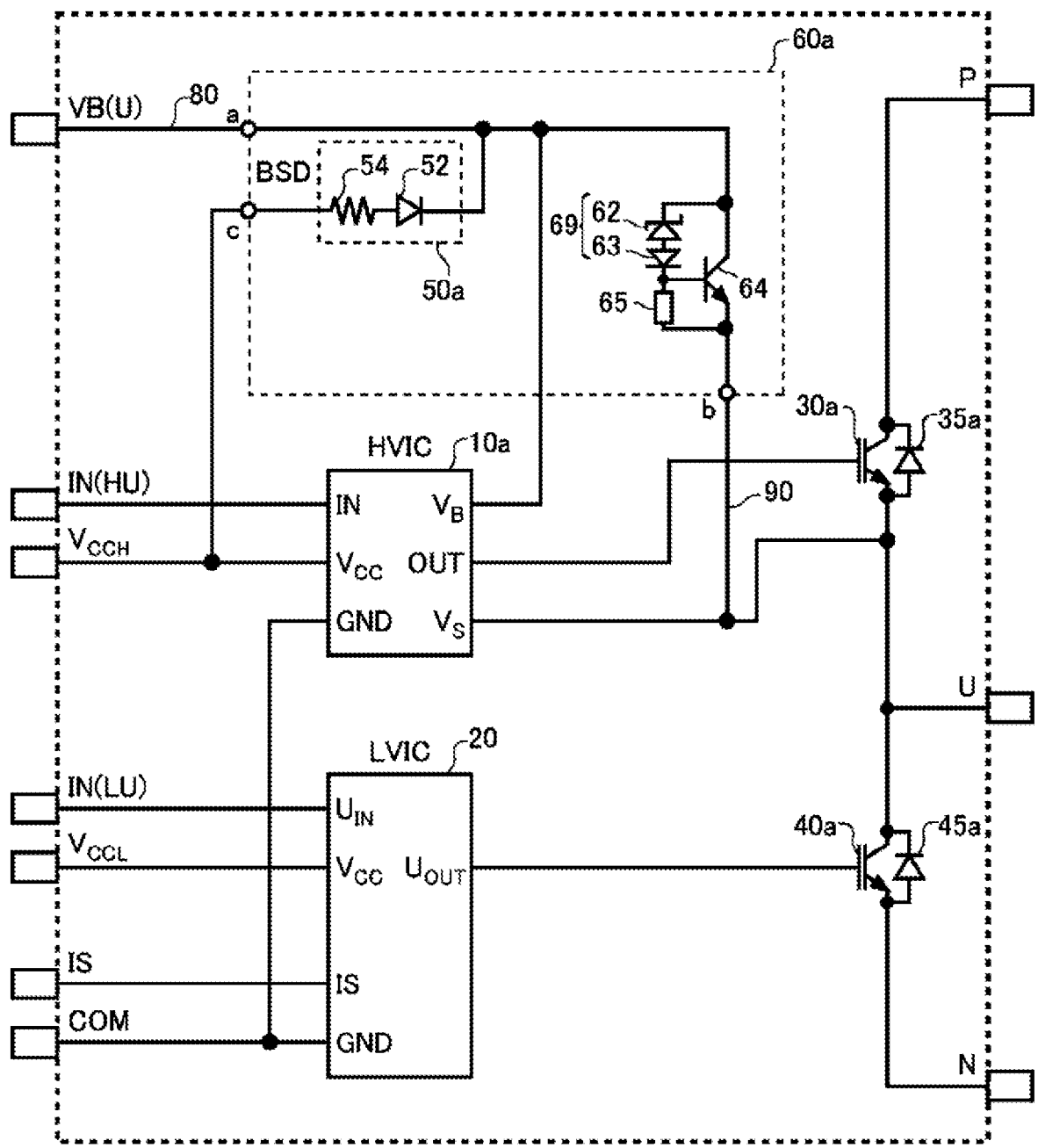
FIG. 6A shows a variation of the semiconductor device 100.

FIG. 6A shows a variation of the semiconductor device 100. The semiconductor device 100 of the present example is different from the embodiment of FIG. 1B in that it comprises a protection circuit section 60 in which a bootstrap section 50 is incorporated. In the present example, points different from the embodiment of FIG. 1B are particularly described.

The state in which the bootstrap section 50 is incorporated in the protection circuit section 60 may refer to a state in which the protection circuit section 60 and the bootstrap section 50 are provided in the same chip. Although a case of the U-phase where the bootstrap section 50a is incorporated in the protection circuit section 60a is shown in the present example, the bootstrap sections 50 of other phases may also be incorporated in the respective protection circuit sections 60. As with the example of FIG. 4A, the protection circuit section 60a of the present example includes an npn transistor 64, a resistor 65, and a reverse blocking Zener diode 69.

The protection circuit section 60a of the present example includes three terminals: a terminal a, a terminal b and terminal c. The terminal a is connected to a node extension unit 80 of high-side power supply potential, and the terminal b is connected to a node extension unit 90 of reference potential of each phase. The terminal c is connected to a high-side control power supply terminal $V_{CCH}$ and a power supply voltage input terminal $V_{CC}$. Note that by generating a diode 52, a Zener diode 62, a diode 63 and a resistor 65 as vertical type elements in the same semiconductor substrate, the protection circuit section 60 in which the bootstrap section 50 is incorporated can be provided without additional costs.

Figure 6B:
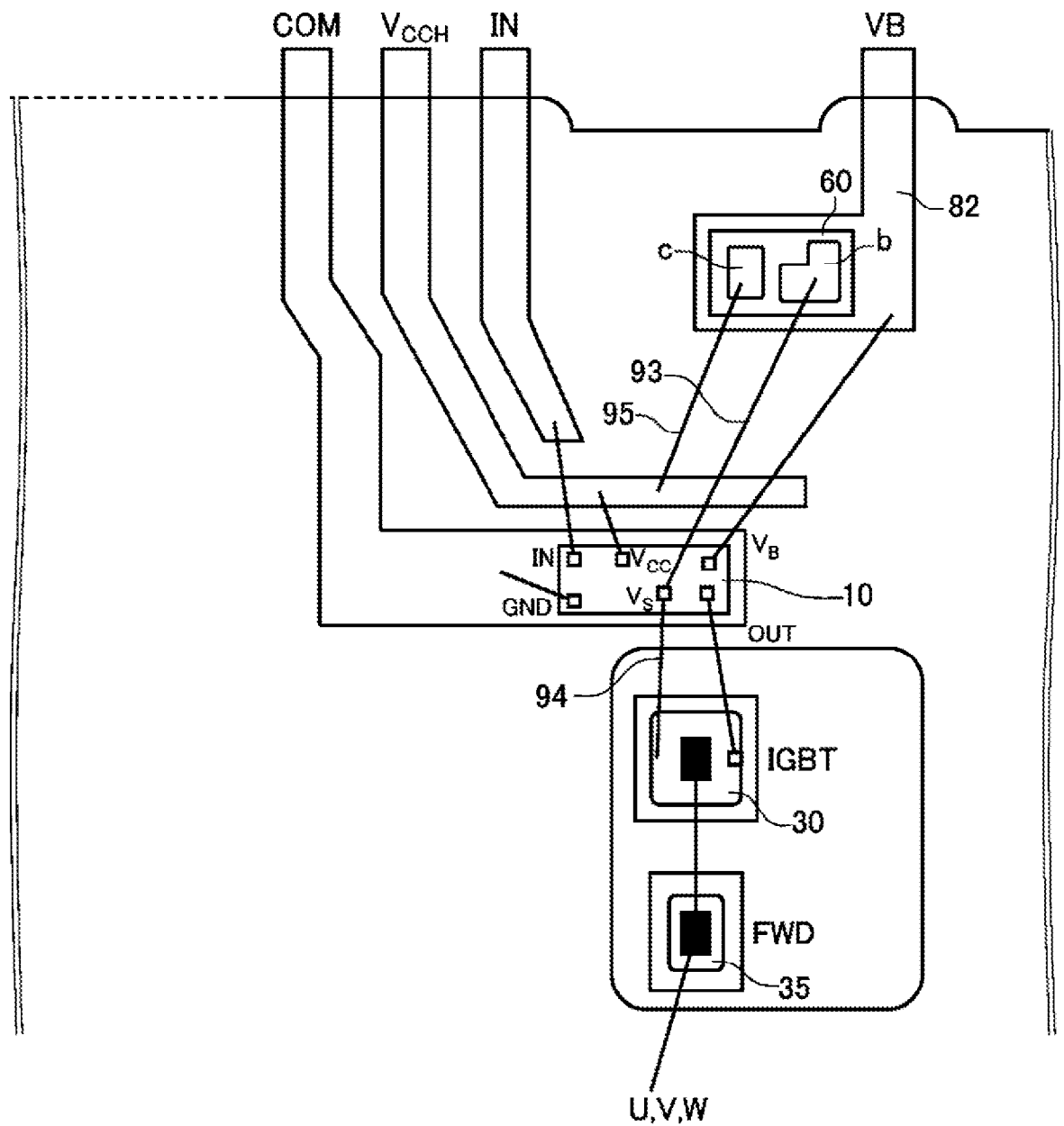
FIG. 6B shows an example of an implementation method of the semiconductor device 100 of FIG. 6A.

FIG. 6B shows an example of an implementation method of the semiconductor device 100 of FIG. 6A. The bootstrap section 50 is incorporated in the protection circuit section 60 of the present example. The protection circuit section 60 includes the terminal a on the lower surface and includes the terminal b and the terminal c on the upper surface. The protection circuit section 60 is provided on the upper surface of the inner lead 82, and the terminal a is electrically connected to the inner lead 82. The terminal b is connected to the reference potential terminal Vs by the bonding wire 93. The terminal c is connected to the high-side control power supply terminal $V_{CCH}$ by the bonding wire 95.

The bonding wire 94 of the present example is shorter than the bonding wire 93. In other words, the high-side switching device 30 is arranged closer to the high-side driver 10 than is the terminal b of the protection circuit section 60. Note that the bonding wire 93 is an example of a first bonding wire for electrically connecting the high-side driver 10 and the protection circuit section 60. The bonding wire 94 is an example of a second bonding wire for electrically connecting the high-side driver 10 and the high-side switching device 30.

Figure 6C:
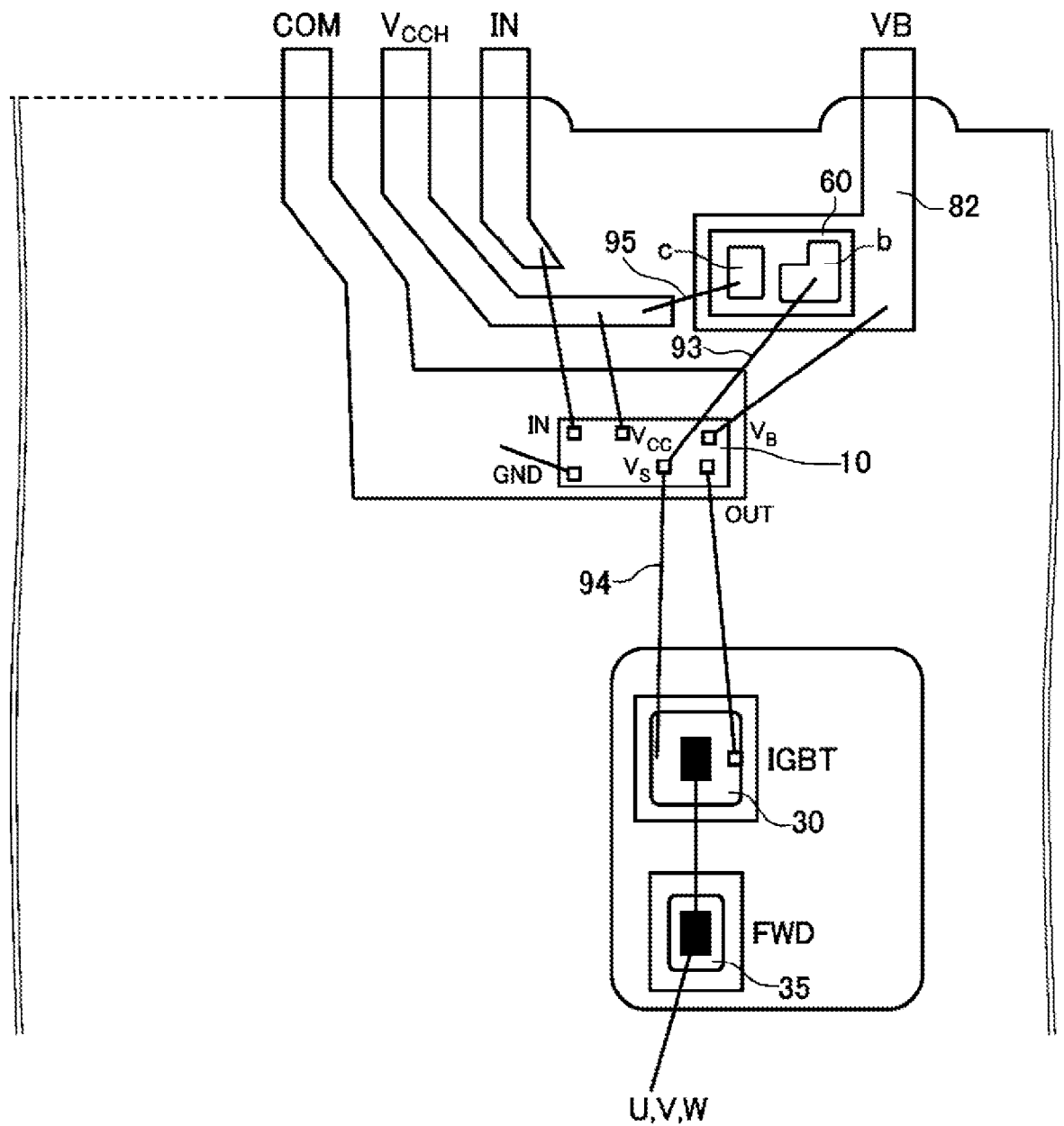
FIG. 6C shows a variation of the implementation method of the semiconductor device 100.

FIG. 6C shows a variation of the implementation method of the semiconductor device 100. The bonding wire 94 of the present example is longer than the bonding wire 93. In other words, the high-side switching device 30 is arranged farther away from the high-side driver 10 than is the terminal b the protection circuit section 60. Thus, the semiconductor device 100 can freely change the length of the bonding wire 93 and bonding wire 94 by changing the shape of the inner lead which is connected to the external terminal. The bonding wire 94 may have a length identical with the length of the bonding wire 93. In the present example, no inner lead of the high-side control power supply terminal $V_{CCH}$ is provided between the protection circuit section 60 and the high-side driver 10. Therefore, the protection circuit section 60, the high-side driver 10 and the high-side switching device 30 are arrayed in this order, and the layout area of the entire semiconductor device 100 can be reduced.

Figure 7:
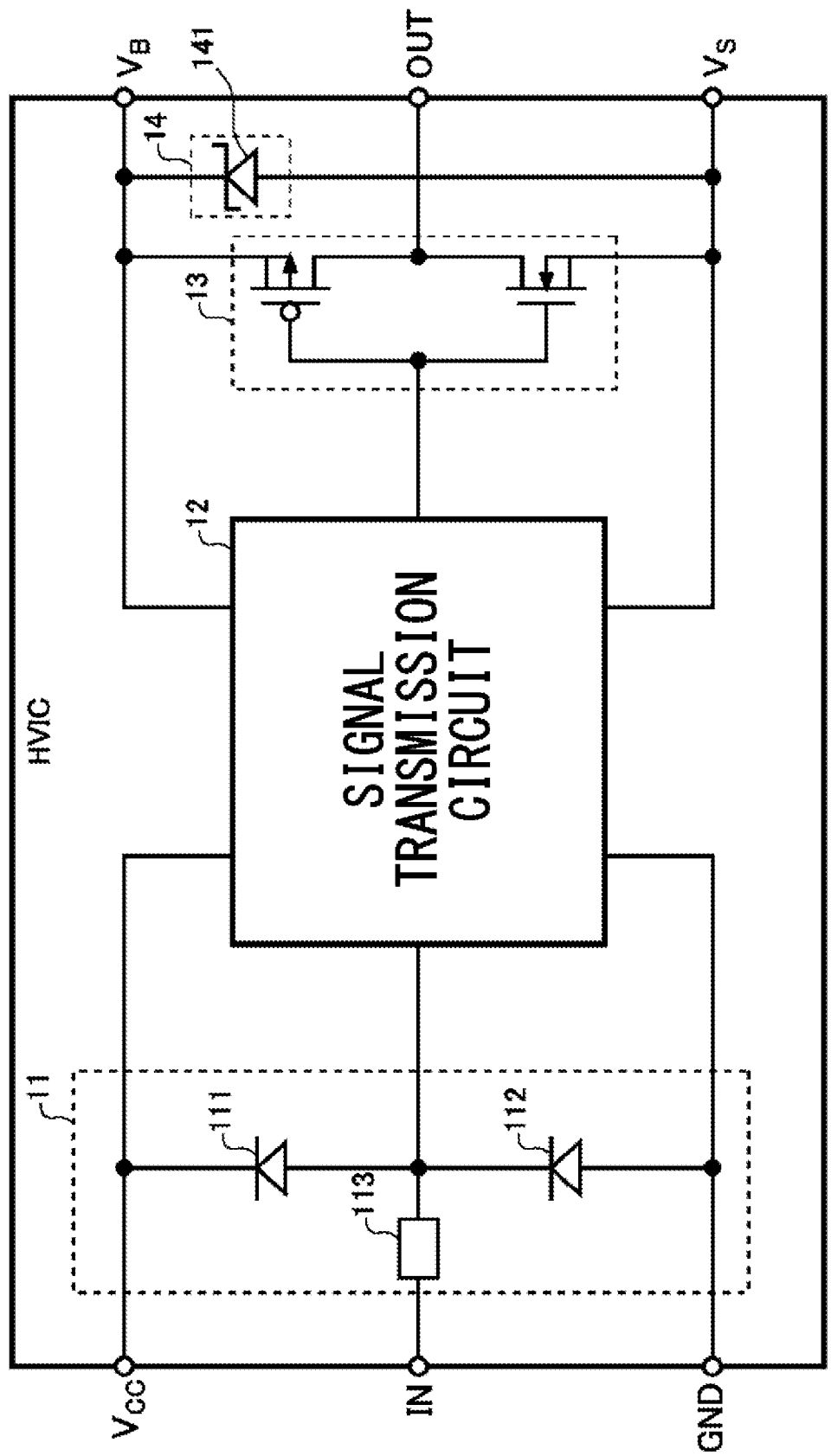
FIG. 7 shows an example of the specific configuration of the high-side driver 10.

FIG. 7 shows an example of the specific configuration of the high-side driver 10. The high-side driver 10 includes an IN protection circuit 11, a signal transmission circuit 12, an output unit 13, a VB protection circuit 14.

The IN protection circuit 11 includes a diode 111, a diode 112, and a resistor 113. The diode 111 and the diode 112 are connected in series between the power supply voltage input terminal $V_{CC}$ and the ground terminal GND. The resistor 113 is connected between the input terminal IN and the connection node of the diode 111 and the diode 112. Because stable power source is supplied from the power supply voltage input terminal $V_{CC}$, and restriction of input current is allowed, the input terminal IN can constitute a protection circuit of the diodes and the resistor.

The signal transmission circuit 12 generates a transmission signal in accordance with an IN signal, which is input from the input terminal IN, so as to output the transmission signal to an output unit 13. The IN signal is a signal corresponding to the voltage between the external terminal IN and the common external ground terminal COM. The output unit 13, which has a CMOS circuit, outputs a control signal to be input into the gate terminal of the high-side switching device 30 in accordance with the transmission signal from the signal transmission circuit 12.

The VB protection circuit 14 includes a Zener diode 141, which is provided between the high-side power supply terminal Vs and the reference potential terminal Vs. The VB protection circuit 14 is configured of a protection circuit of the Zener diode 141 because using a circuit configuration where resistors are connected in series is difficult in practical applications. Herein, IC withstand voltage (that is, between Vs and Vs) may be larger than the withstand voltage of the Zener diode 141. The withstand voltage of the Zener diode 141 may be larger than the withstand voltage of the Zener diode 62 of the protection circuit section 60. Thereby, the surge having occurred is more likely consumed by passing through the Zener diode 62 of the protection circuit section 60 rather than through the Zener diode 141, which facilitates preventing the destruction of the Zener diode 141. The withstand voltage of the Zener diode 62 of the protection circuit section 60 may be larger than a VB power supply voltage which is substantially equal to the control power supply voltage VCC.

Note that in a case where the protection circuit section 60 is not provided in the semiconductor device 100, overvoltage of the high-side power supply terminal Vs may have a large energy, and a protection circuit configuration of only Zener diode 141 is less likely to have enough effects of the overvoltage protection, and thus it is possible that the Zener diode 141 is destructed. The amount of energy possible to flow into the protection circuit section 60 may be larger than the amount of energy possible to flow into the Zener diode 141. Thereby, the protection circuit section 60 can withstand the noise of enough amount of energy. On the other hand, the Zener diode 141 is provided in the interior of the high-side driver 10 and thus can protect the high-side driver 10 by quickly reacting to the noise having occurred near the high-side driver 10.

Figure 8A:
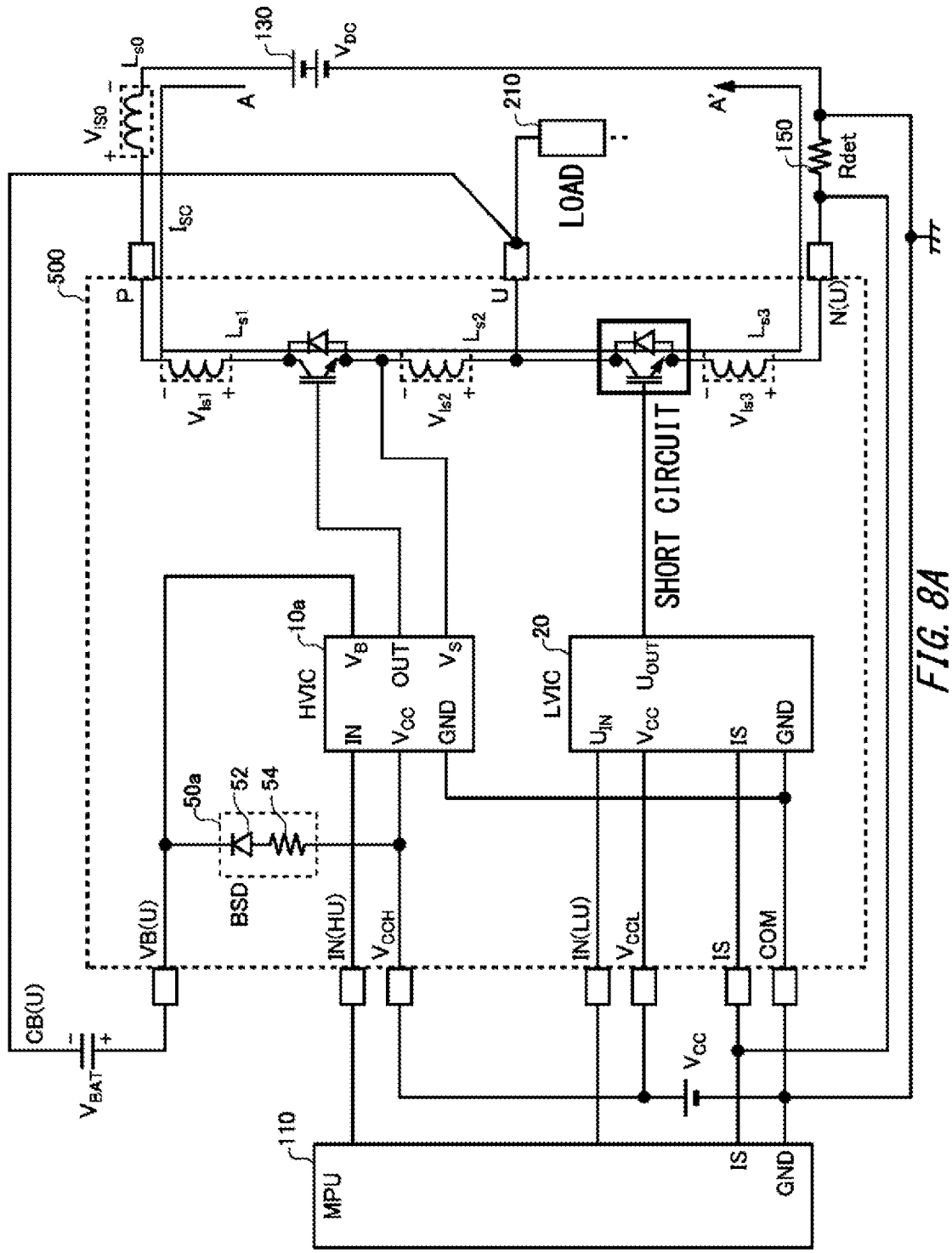
FIG. 8A shows the configuration of a semiconductor device 500 according to a comparative example.

FIG. 8A shows the configuration of a semiconductor device 500 according to a comparative example. When a short circuit occurs in one of low-side switching devices 40 on the lower arm side, and one of the high-side switching devices 30 on the upper arm side is turned on, a short-circuit current $I_{SC}$ flows. The short-circuit current $I_{SC}$ flows in a current detection resistor 150, and then a control section 110 detects the short-circuit current $I_{SC}$ being overcurrent and turns off the high-side switching device 30 on the upper arm side which has been turned on. The short-circuit current $I_{SC}$ has a current path flowing from A to A', and when the upper arm is interrupted, counter-electromotive voltages ($V_{ls0}$, $V_{ls1}$, $V_{ls2}$, and $V_{ls3}$) due to each parasitic inductance occur.

Herein, a collector-emitter voltage of the high-side switching device 30 applied during interruption, Vce (sc), and a power terminal voltage of the high-side driver 10, (VB−VS), are presented using the following equation.

$$Vce(sc) = VDC + V_{ls0} + V_{ls1} + V_{ls2} + V_{ls3}$$

$$VB - VS = V_{BAT} + V_{ls2}$$

Thus, in the power terminal voltage of the high-side driver 10 (VB−VS), a counter-electromotive voltage $V_{ls2}$ may occur due to the parasitic inductance $L_{s2}$ in an emitter wiring portion of the high-side switching device 30. If the power terminal voltage becomes overvoltage, for example the sum of the counter-electromotive voltage $V_{ls2}$ and the high-side power supply voltage $V_{BAT}$ overvoltage exceeds the withstand voltage of the high-side driver 10, there is a risk of the malfunction or destruction of the high-side driver 10.

Compared to this, even when surge voltages are superimposed and exceed a rated voltage of the high-side driver 10, the semiconductor device 100 can effectively absorb the surge voltages by comprising a protection circuit section 60 in parallel to an emitter wiring portion in which a parasitic inductance $L_{s2}$ occurs. Thereby, it can prevent a malfunction and destruction of the high-side driver 10.

Figure 8B:
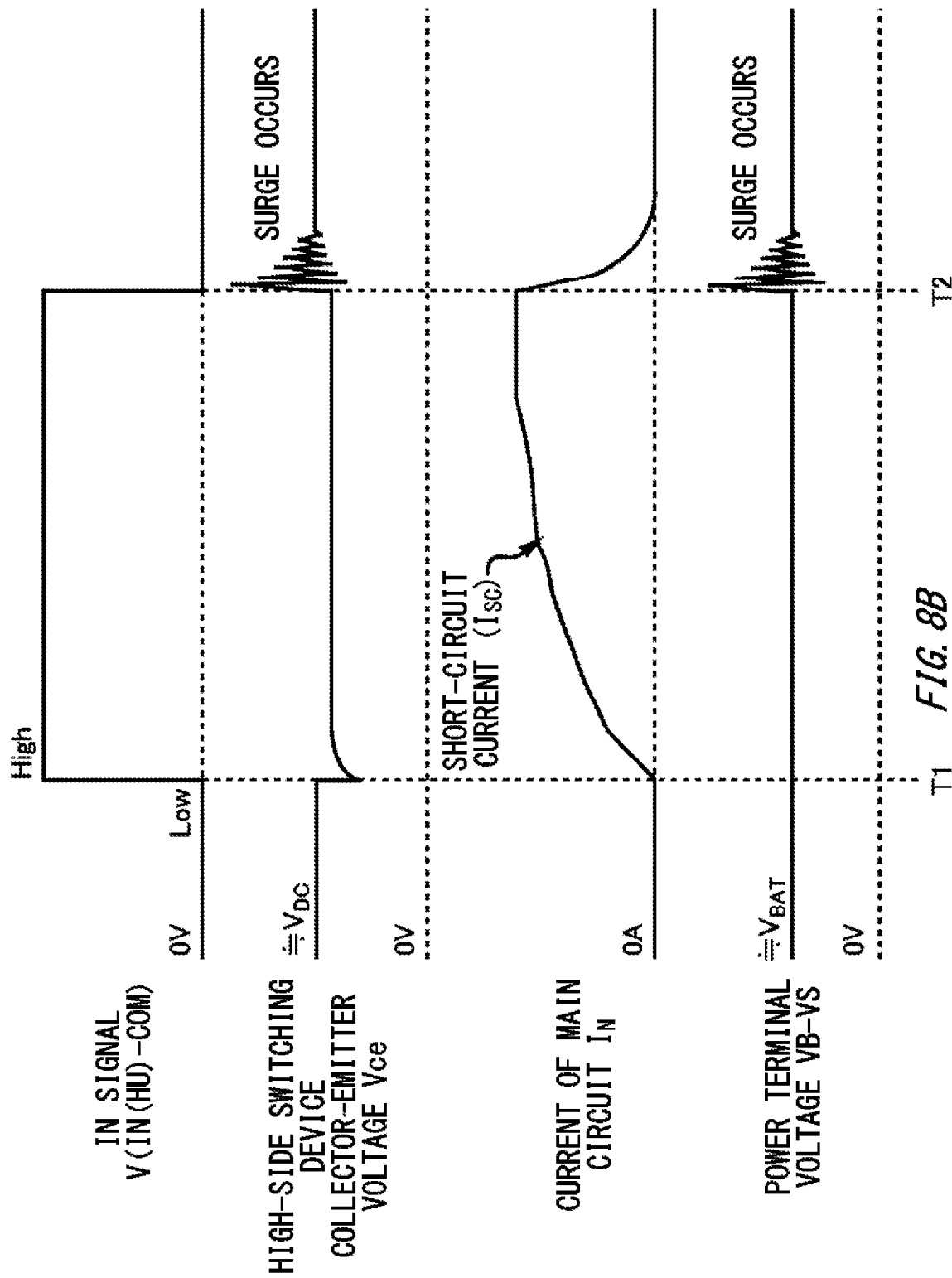
FIG. 8B shows an operation time chart during a short circuit protection operation.

FIG. 8B shows an operation time chart during a short circuit protection operation. At time T1, an IN signal becomes high from low, and a short-circuit current $I_{SC}$ starts flowing from the positive terminal P to the negative terminal N (U). The short-circuit current $I_{SC}$ is detected at the current detection resistor 150 and a short circuit abnormality is determined at the low-side driver 20. The low-side driver 20 interrupts the low-side switching device 40 in response to the determined short circuit abnormality.

At time T2, the IN signal becomes low by the instruction from the control section 110, which has received a signal of the current detection resistor 150, and the high-side driver 10 interrupts the high-side switching device 30. Then a surge voltage occurs in the collector-emitter voltage Vce of the high-side switching device 30 and in the power terminal voltage (VB−VS) of the high-side driver 10. The magnitude of the surge voltage changes in accordance with a parasitic inductance of a wiring path or the like, an interrupting speed of the high-side switching device 30, a direct current voltage Vdc, a short-circuit current $I_{SC}$ or the like.

Consequently, if any of the high-side switching devices 30 on the upper arm side is in a short circuit fault, and it is a case of an arm short circuit where a low-side switching device 40 on the lower arm side is turned on, the low-side driver 20 determines overcurrent and interrupts low-side switching device 40. In this case, because it takes short period of time since the overcurrent determination until the interruption, the short circuit current descripted in FIG. 8B does not flow for a long period of time, and thus the magnitude is relatively small. On the other hand, if it is a case of an arm short circuit where the short-circuit current $I_{SC}$ flows or the like, based on the overcurrent determination at the control section 110, the high-side driver 10 interrupts the high-side switching device 30. In this case, it takes long period of time since the overcurrent determination until the interruption, and the short-circuit current $I_{SC}$ becomes larger as the flowing period of time becomes longer. Thus, the short-circuit current $I_{SC}$ just before the interruption becomes more than multiple times larger a normal current, and when interrupting this, the di/dt (amount of current change per unit time) also increases more than multiple times. Due to this increased di/dt, if large counter-electromotive forces ($V_{ls1}$, $V_{ls2}$, $V_{ls3}$, $V_{ls0}$) occur in the above-mentioned parasitic inductance, and overvoltage is applied to the high-side switching device 30 on the upper arm to be interrupted; large voltage is applied to a power terminal voltage (VB−VS), there is a risk that the high-side driver 10 is destructed.

Note that if it is a case of load short circuit (not depicted), while the low-side driver 20 determines overcurrent, and the low-side switching device 40 is interrupted in the lower arm, in the upper arm, high-side driver 10 interrupts the high-side switching device 30 based on the overcurrent determination in the control section 110. Therefore, the overcurrent protection on the upper arm may be later than the overcurrent protection on the lower arm. Thus, the short-circuit current $I_{SC}$ interrupted in the lower arm in advance results in being commutated to the upper arm side, and then the commutated short-circuit current $I_{SC}$ needs to be interrupted by the high-side switching device 30.

Herein, the short-circuit current $I_{SC}$ becomes more than several times larger a normal operation current, the di/dt for interrupting this also increases more than several times. Due to the di/dt increased in this way, if a large counter-electromotive force occurs in a parasitic inductance which forms a circuit shape on the commutating path of the short-circuit current $I_{SC}$; and overvoltage is applied to the high-side switching device 30 of the upper arm to be interrupted, there is a risk that the high-side switching device 30 is destructed.

The semiconductor device 100 of the present example can prevent the destruction of the high-side driver 10 by an inductive voltage occurring in a parasitic inductance, the inductive voltage accompanying the short-circuit current $I_{SC}$ which flow at the time of short circuit of the switching device. Also, the semiconductor device 100 comprises a protection circuit section 60 and thus needs no additional parts for countermeasures outside the semiconductor device 100. Therefore, there is a small impact on the system, which can reduce cost of countermeasures. Thus, a reliable semiconductor module can be achieved.

Note that in the embodiments of the present invention, if the control section 110 has detected current from the overcurrent detect external terminal IS and has determined that the current flowing in the current detection resistor 150 is overcurrent, then a controlling by turning off the high-side switching device 30 of the upper arm is performed. A signal line for transmitting overcurrent detection result so as to transmit the result of detecting current from the overcurrent detect external terminal IS which is detected by the low-side driver 20 to the control section 110 is provided between the control section 110 and the low-side driver 20, and the low-side driver 20 detects the current from the overcurrent detect external terminal IS. Then, the current flowing in the current detection resistor 150 is determined to be overcurrent. After that, the control section 110 receives that information from the signal line for transmitting overcurrent detection result, and the controlling by turning off the high-side switching device 30 of the upper arm may be performed.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: high-side driver, 11: IN protection circuit, 12: signal transmission circuit, 13: output unit, 14: VB protection circuit, 20: low-side driver, 30: high-side switching device, 35: high-side diode, 40: low-side switching device, 45: low-side diode, 50: bootstrap section, 52: diode, 53: bonding wire, 54: resistor, 60: protection circuit section, 61: capacitor, 62: Zener diode, 63: diode, 64: npn transistor, 65: resistor, 66: n-channel MOSFET, 69: reverse blocking Zener diode, 80: node extension unit, 81: connecting part, 82: inner lead, 90: node extension unit, 91: connecting part, 92: inner lead, 93: bonding wire, 94: bonding wire, 95: bonding wire, 100: semiconductor device, 105: reference potential, 107: terminal, 110: control section, 111: diode, 112: diode, 113: resistor, 130: power supply, 140: capacitor, 141: Zener diode, 150: current detection resistor, 200: semiconductor system, 210: load, 500: semiconductor device

What is claimed is:

1. A semiconductor device comprising:
   a high-side switching device;
   a low-side switching device;
   a high-side driver configured to turn on/off the high-side switching device;
   a low-side driver configured to turn on/off the low-side switching device;
   a high-side driving external terminal connected to a first terminal of a bootstrap capacitor for receiving a power supply voltage for driving the high-side driver;
   a protection circuit section connected between the high-side driving external terminal and a reference potential terminal of the high side driver;
   an output external terminal outputs an output signal of the high-side switching device and the low-side switching device;
   wherein the high-side driving external terminal is connected to a high-side power supply terminal of the high-side driver and a cathode of a bootstrap diode,
   wherein the high-side driver includes the reference potential terminal set to a reference potential of the high-side driver and the high-side power supply terminal set to the power supply voltage of the high-side driver,
   wherein the output external terminal is connected to the reference potential terminal of the high-side driver and is configured to be connected to a second terminal of the bootstrap capacitor, and
   wherein the protection circuit section is connected between the high-side driving external terminal and the reference potential terminal.

2. The semiconductor device according to claim 1, wherein the high-side driver includes the high-side power supply terminal connected to the high-side driving external terminal,
   wherein the reference potential terminal is connected to an emitter terminal of the high-side switching device, and
   wherein the protection circuit section is connected between the high-side power supply terminal and the emitter terminal.

3. The semiconductor device according to claim 1, wherein the protection circuit section includes a capacitor connected between the high-side driving external terminal and the reference potential terminal.

4. The semiconductor device according to claim 2, wherein the protection circuit section includes a capacitor connected between the high-side driving external terminal and the reference potential terminal.

5. The semiconductor device according to claim 1, wherein the protection circuit section includes a diode and a Zener diode connected in series between the high-side driving external terminal and the reference potential terminal.

6. The semiconductor device according to claim 2, wherein the protection circuit section includes a diode and a Zener diode connected in series between the high-side driving external terminal and the reference potential terminal.

7. The semiconductor device according to claim 1, wherein the protection circuit section includes a plurality of Zener diodes connected in series between the high-side driving external terminal and the reference potential terminal.

8. The semiconductor device according to claim 2, wherein the protection circuit section includes a plurality of Zener diodes connected in series between the high-side driving external terminal and the reference potential terminal.

9. The semiconductor device according to claim 1, the protection circuit section includes a dynamic clamp circuit connected between the high-side driving external terminal and the reference potential terminal.

10. The semiconductor device according to claim 2, the protection circuit section includes a dynamic clamp circuit connected between the high-side driving external terminal and the reference potential terminal.

11. The semiconductor device according to claim 9, wherein the dynamic clamp circuit includes:
   a transistor;
   a reverse blocking Zener diode connected between a collector terminal and a base terminal of the transistor; and
   a resistor connected between an emitter terminal of the transistor and the base terminal.

12. The semiconductor device according to claim 9, wherein the dynamic clamp circuit includes:
   a MOSFET;
   a reverse blocking Zener diode connected between a drain terminal and a gate terminal of the MOSFET; and
   a resistor connected between a source terminal of the MOSFET and the gate terminal.

13. The semiconductor device according to claim 1, wherein the protection circuit section has a horizontal type semiconductor element structure.

14. The semiconductor device according to claim 2, wherein the protection circuit section has a horizontal type semiconductor element structure.

15. The semiconductor device according to claim 1, wherein the protection circuit section has a vertical type semiconductor element structure.

16. The semiconductor device according to claim 1, comprising a bootstrap section connected between the high-side driving external terminal and a power supply voltage input terminal of the high-side driver, wherein the bootstrap section is incorporated in the protection circuit section in an identical chip.

17. The semiconductor device according to claim 1, wherein a length of a first bonding wire for electrically connecting the high-side driver and the protection circuit section is longer than a length of a second bonding wire for electrically connecting the high-side driver and the high-side switching device.

18. The semiconductor device according to claim 1, wherein a length of a first bonding wire for electrically connecting the high-side driver and the protection circuit section is shorter than a length of a second bonding wire for electrically connecting the high-side driver and the high-side switching device.

19. The semiconductor device according to claim 1,
   wherein the high-side driver includes a Zener diode provided between the high-side power supply terminal and the reference potential terminal,
   wherein a withstand voltage of the Zener diode of the high-side driver is larger than a withstand voltage of the protection circuit section.

20. The semiconductor device according to claim 1,
   wherein the high-side driver includes a Zener diode provided between the high-side power supply terminal and the reference potential terminal,
   wherein an amount of energy possible to flow in the protection circuit section is larger than an amount of energy possible to flow in the Zener diode of the high-side driver.

21. The semiconductor device according to claim 19, further including:
   a first semiconductor IC including the high-side driver; and
   a second semiconductor IC including the low-side driver, wherein
   the Zener diode is formed in the first semiconductor IC, and
   the protection circuit section is formed outside the first and the second semiconductor IC's.

22. The semiconductor device according to claim 20, further including:
   a first semiconductor IC including the high-side driver; and
   a second semiconductor IC including the low-side driver, wherein
   the Zener diode is formed in the first semiconductor IC, and
   the protection circuit section is formed outside the first and the second semiconductor IC's.

* * * * *